US006954372B2

(12) United States Patent
Matsukawa et al.

(10) Patent No.: US 6,954,372 B2
(45) Date of Patent: Oct. 11, 2005

(54) MAGNETIC STORAGE ELEMENT, PRODUCTION METHOD AND DRIVING METHOD THEREFOR, AND MEMORY ARRAY

(75) Inventors: Nozomu Matsukawa, Nara (JP); Masayoshi Hiramoto, Ikoma (JP); Akihiro Odagawa, Nara (JP); Mitsuo Satomi, Katano (JP); Yasunari Sugita, Kadoma (JP)

(73) Assignee: Matsushita Electric Co., Ltd., Osaka (JP)

( * ) Notice: Subject to any disclaimer, the term of this patent is extended or adjusted under 35 U.S.C. 154(b) by 26 days.

(21) Appl. No.: 10/250,811

(22) PCT Filed: Jan. 18, 2002

(86) PCT No.: PCT/JP02/00327

§ 371 (c)(1), (2), (4) Date: Jul. 8, 2003

(87) PCT Pub. No.: WO02/058166

PCT Pub. Date: Jul. 25, 2002

(65) Prior Publication Data

US 2004/0057295 A1 Mar. 25, 2004

(30) Foreign Application Priority Data

Jan. 19, 2001 (JP) ...................................... 2001-011245

(51) Int. Cl.[7] ................................................ G11C 11/00

(52) U.S. Cl. ........................ 365/158; 365/171; 365/173

(58) Field of Search ................................ 365/158, 171, 365/173

(56) References Cited

U.S. PATENT DOCUMENTS

| | | | | |
|---|---|---|---|---|
| 5,659,499 A | | 8/1997 | Chen et al. | |
| 5,838,608 A | * | 11/1998 | Zhu et al. | 365/158 |
| 5,894,447 A | | 4/1999 | Takashima | |
| 5,902,690 A | | 5/1999 | Tracy et al. | |
| 6,365,236 B1 | | 4/2002 | Maloney | |
| 6,556,473 B2 | | 4/2003 | Saito et al. | |
| 6,590,750 B2 | * | 7/2003 | Abraham et al. | 360/324.2 |

FOREIGN PATENT DOCUMENTS

| | | |
|---|---|---|
| JP | 2000-090658 | 3/2000 |
| JP | 2000-195250 | 7/2000 |

* cited by examiner

*Primary Examiner*—Anh Phung
*Assistant Examiner*—Pho M. Luu
(74) *Attorney, Agent, or Firm*—Hamre, Schumann, Mueller & Larson, P.C.

(57) ABSTRACT

A magnetic memory device that includes a magnetoresistive element, a conductive wire for generating magnetic flux that changes a resistance value of the magnetoresistive element, and at least one ferromagnetic member through which the magnetic flux passes. The ferromagnetic member forms a magnetic gap at a position where the magnetic flux passes through the magnetoresistive element. A length of the magnetoresistive element that is measured in a direction parallel to the magnetic gap is less than or equal to twice the length of the magnetic gap. A length of a path traced by the magnetic flux in the ferromagnetic member is less than or equal to 1.0 $\mu$m. The length of the path is also greater than or equal to five times the thickness of the ferromagnetic member and/or is greater than or equal to a length of the ferromagnetic member in the direction of the drawing of the conductive wire divided by five.

30 Claims, 17 Drawing Sheets

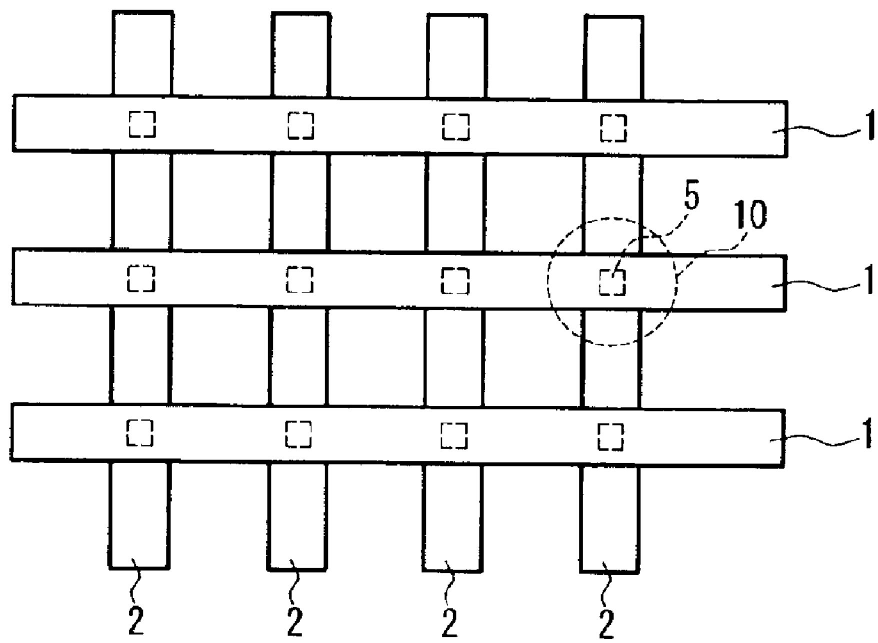
F I G. 1
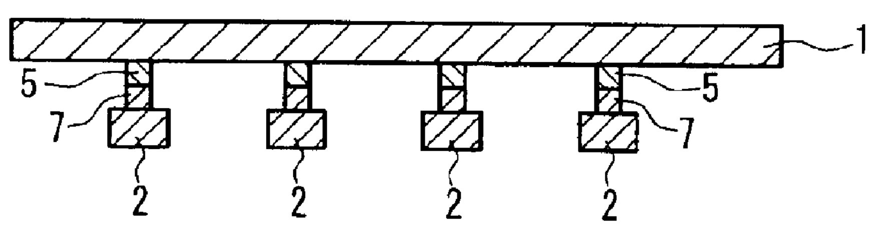
F I G. 2

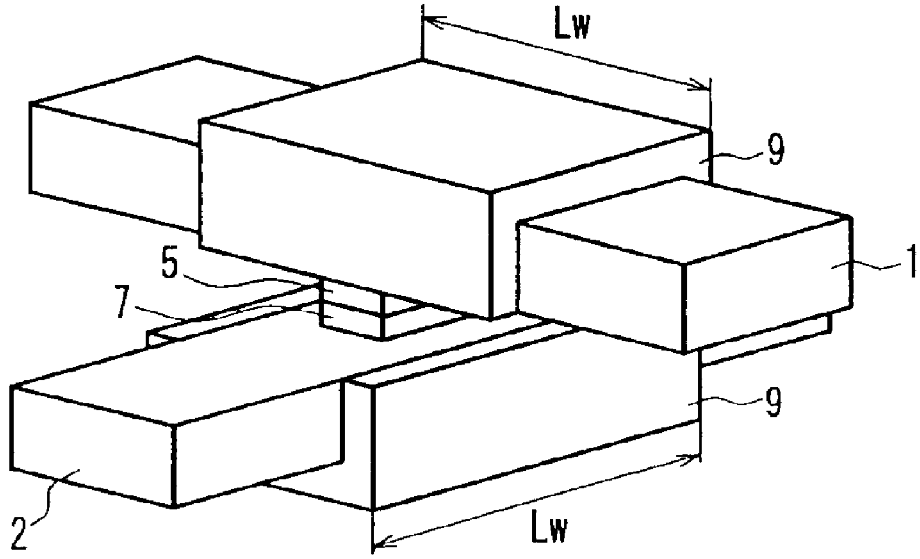
F I G. 3
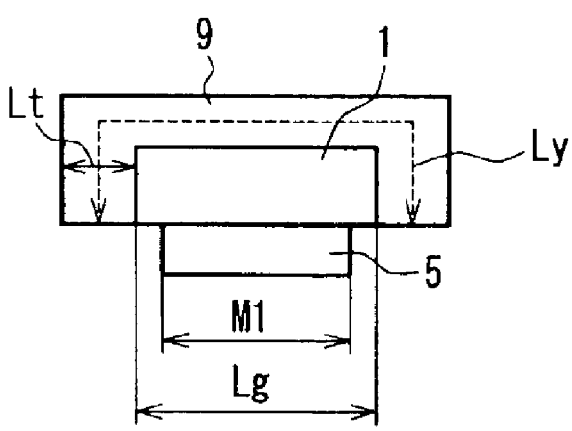
F I G. 4

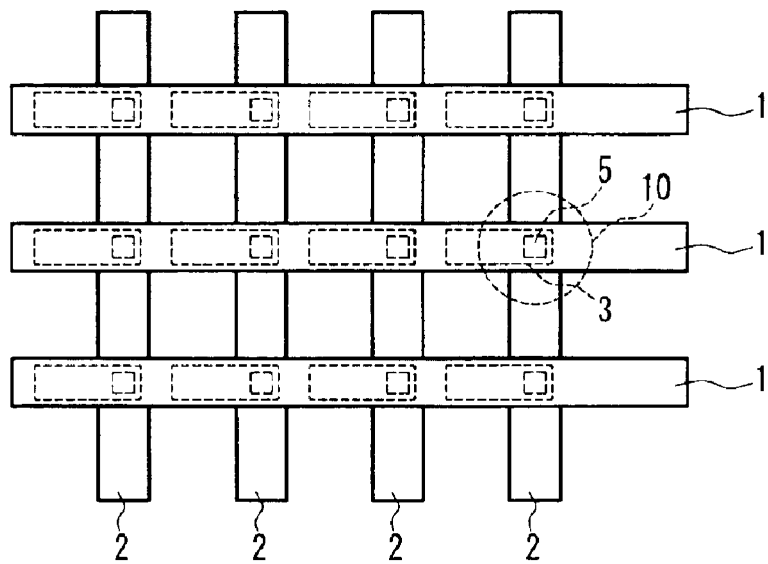
F I G. 5
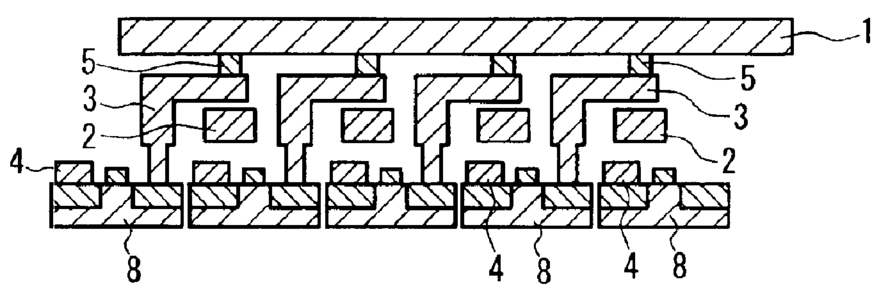
F I G. 6

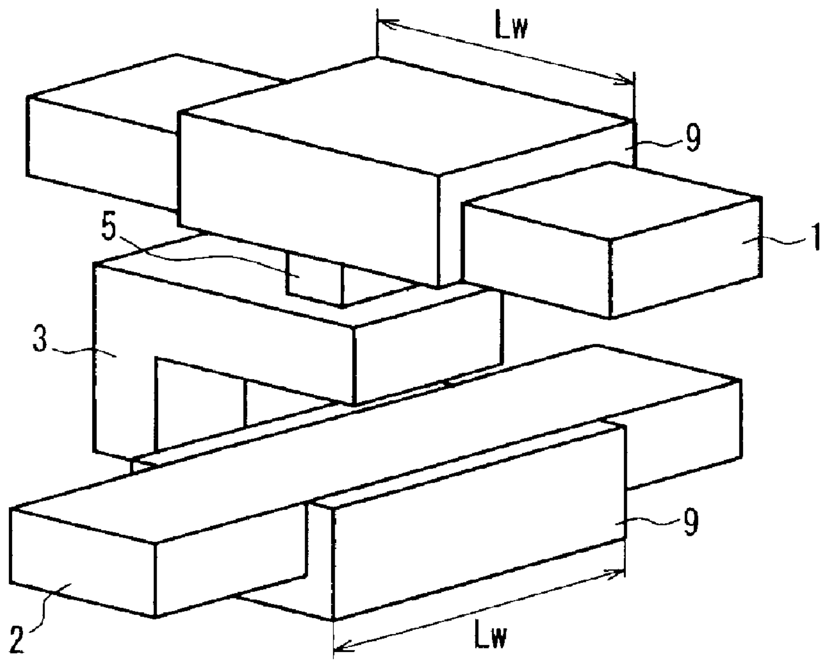
F I G. 7

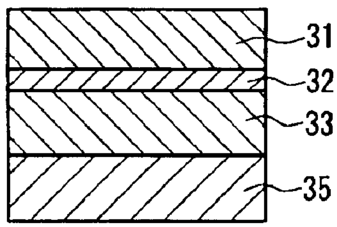
F I G. 9A
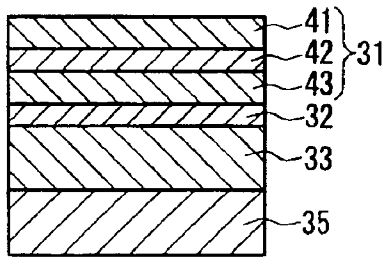
F I G. 9B
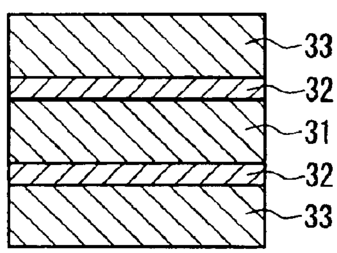
F I G. 9C
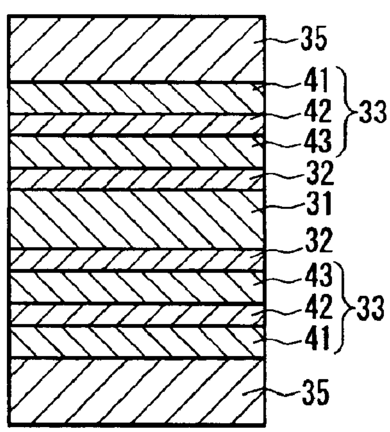
F I G. 9D
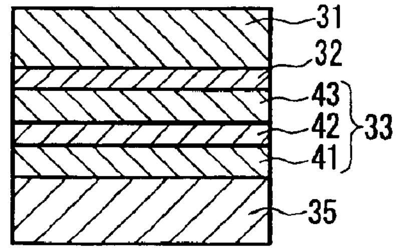
F I G. 9E
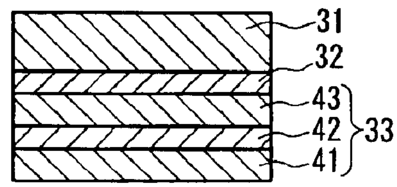
F I G. 9F
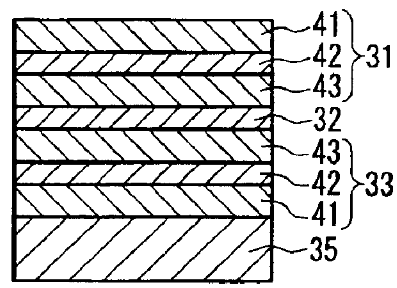
F I G. 9G
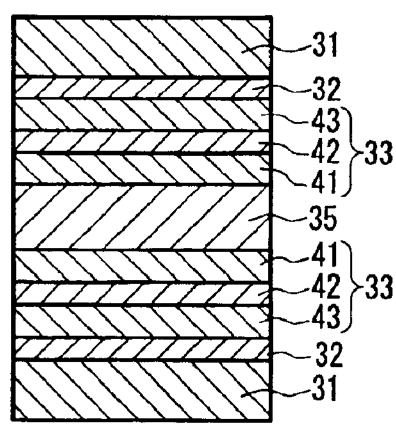
F I G. 9H

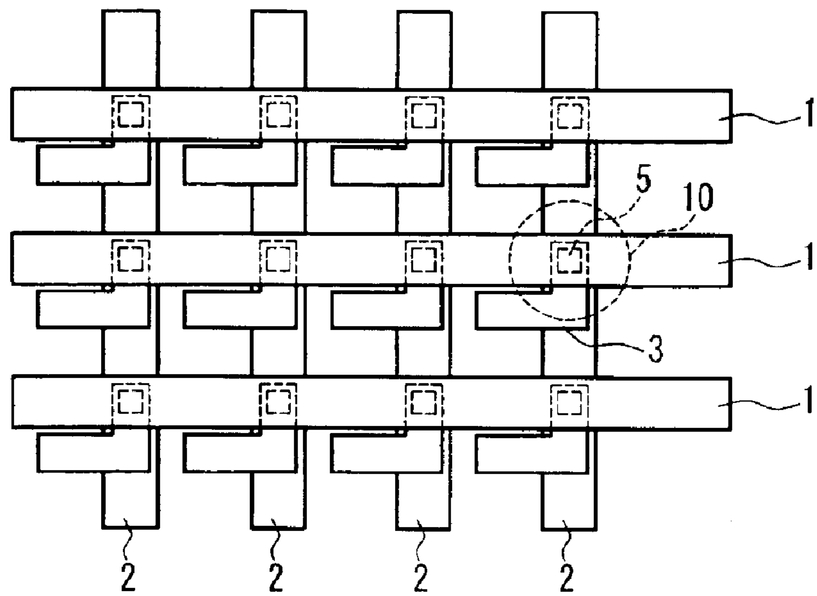
F I G. 1 2
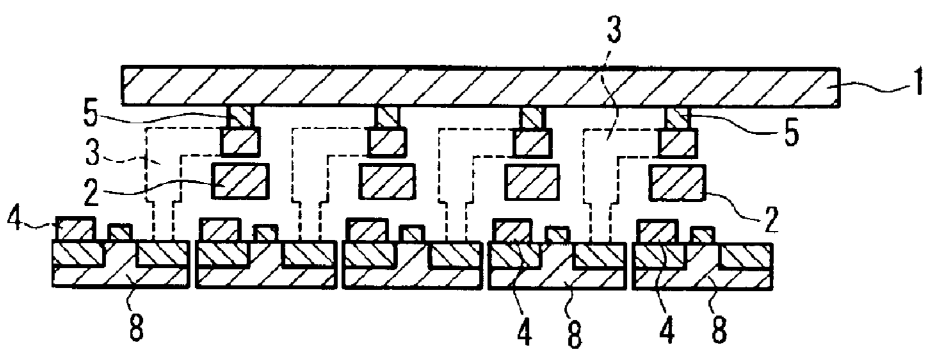
F I G. 1 3

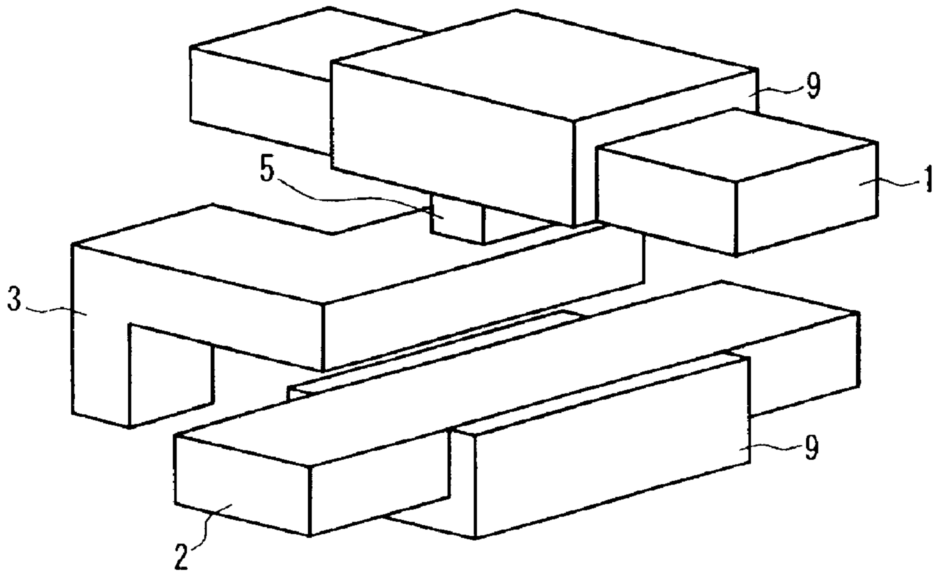
F I G. 1 4
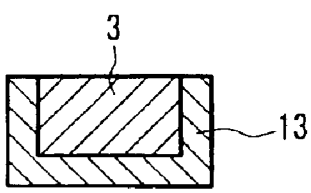
F I G. 1 5A
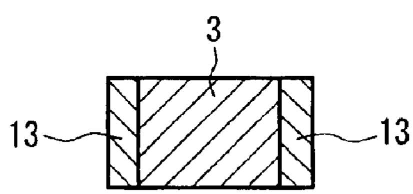
F I G. 1 5B

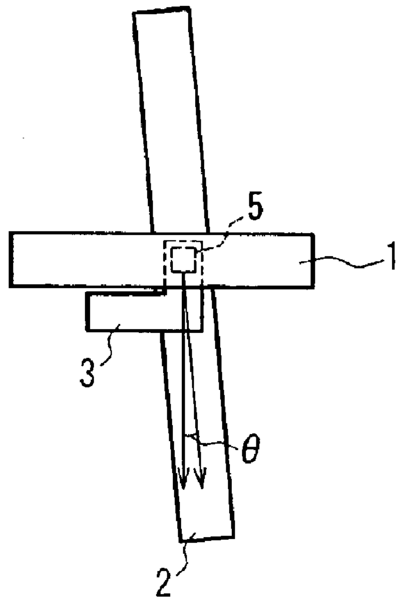
F I G. 1 6
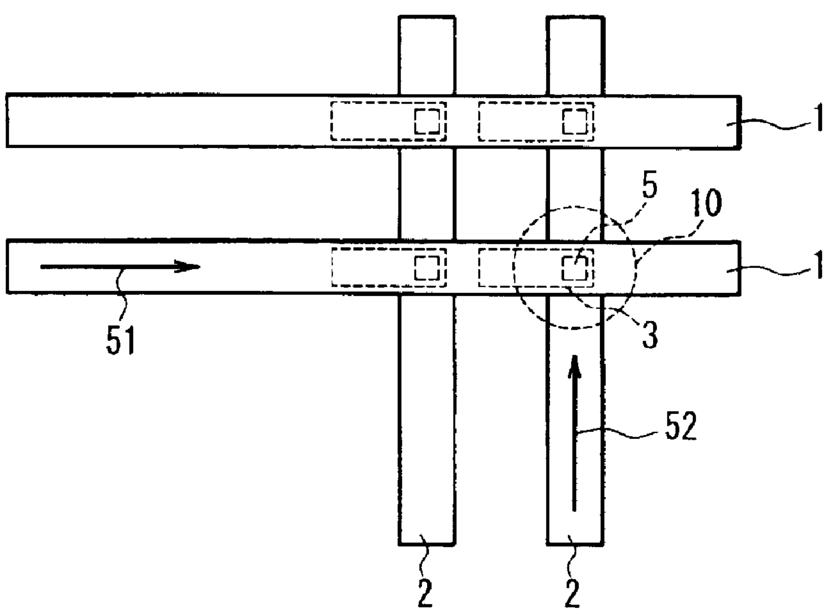
F I G. 1 7

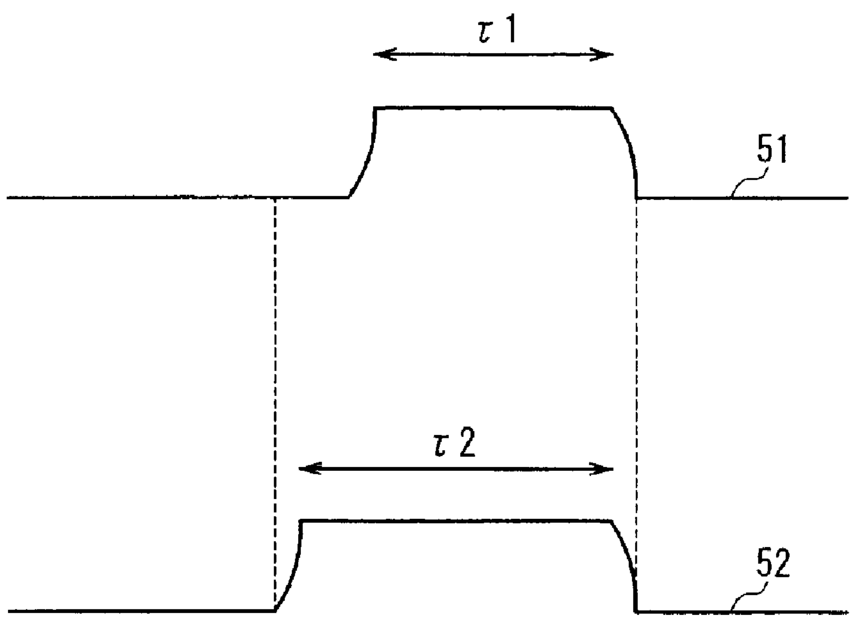
F I G. 1 8

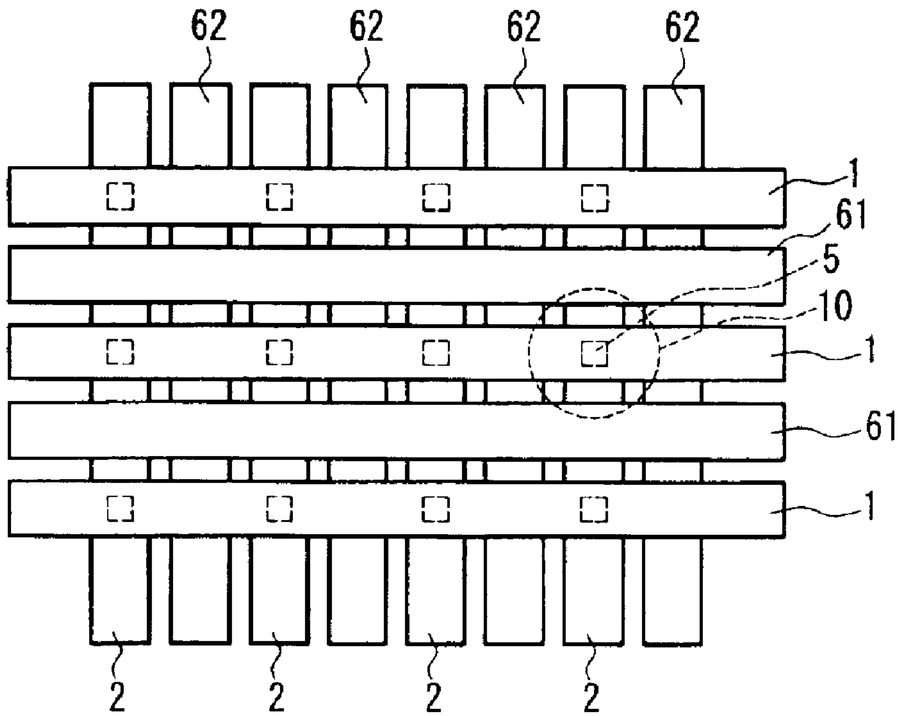
F I G. 19
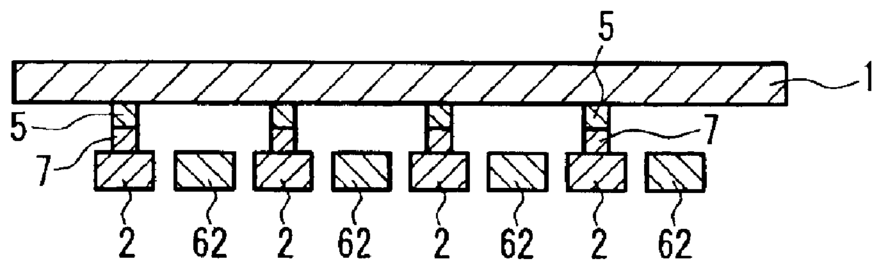
F I G. 20

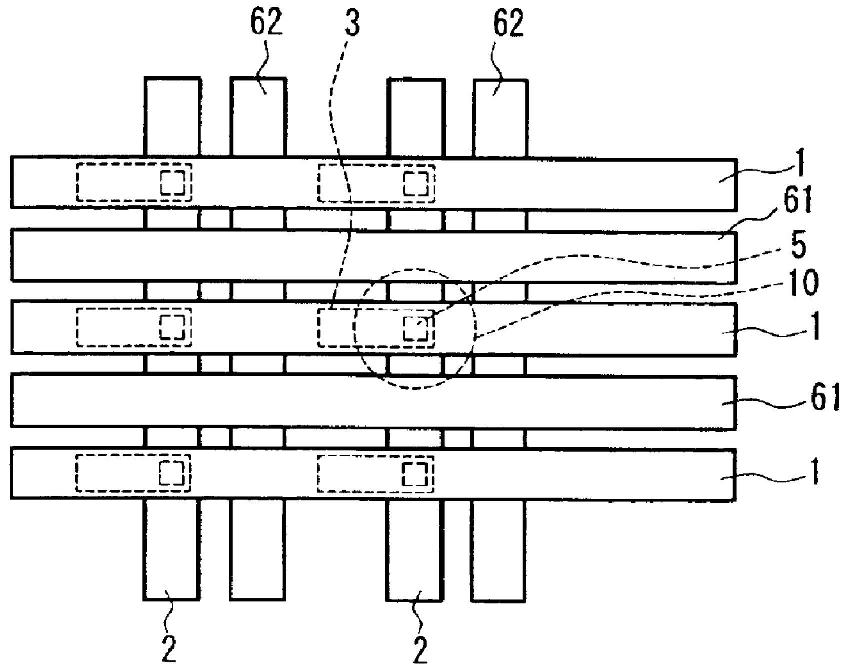
F I G. 2 1
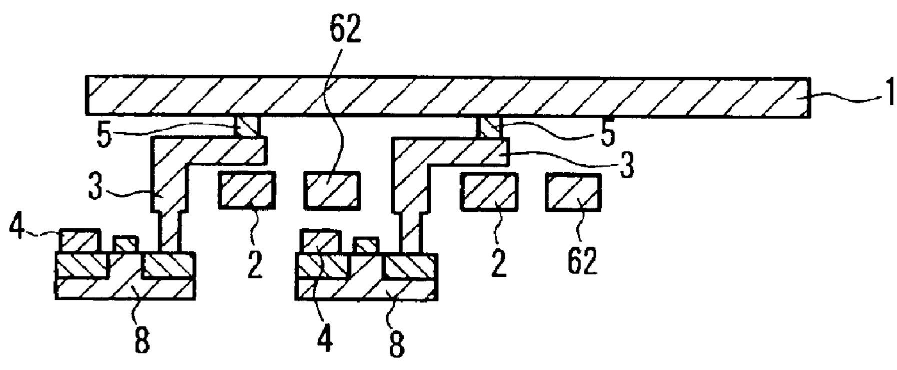
F I G. 2 2

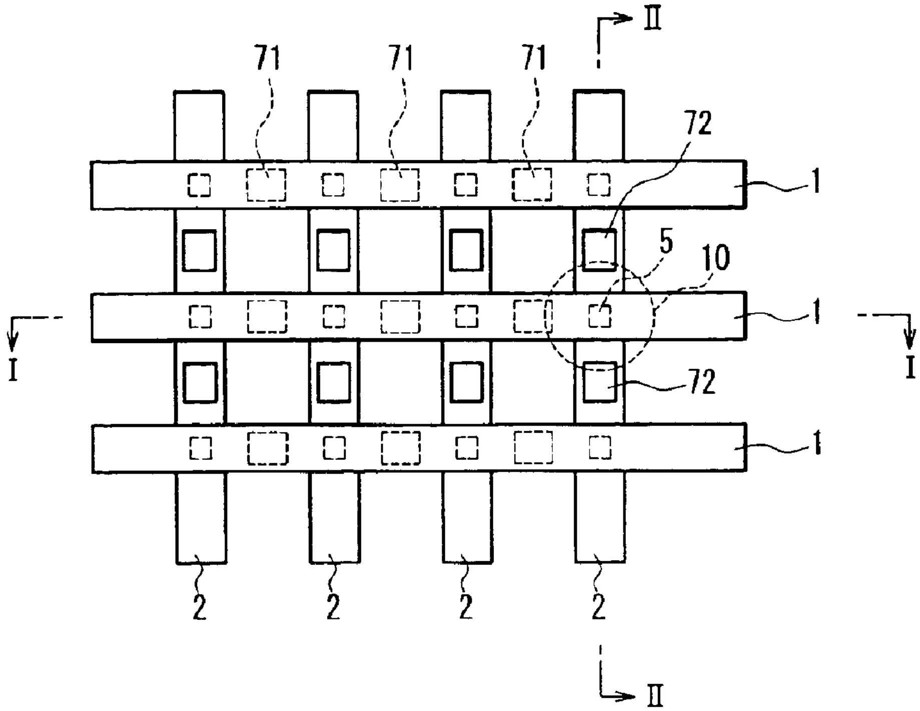
F I G. 2 3
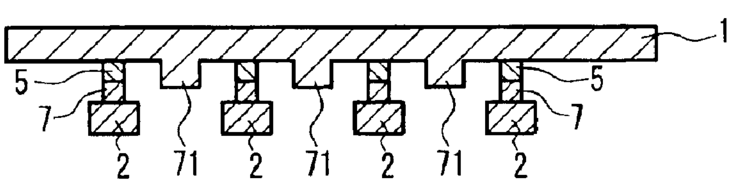
F I G. 2 4 A
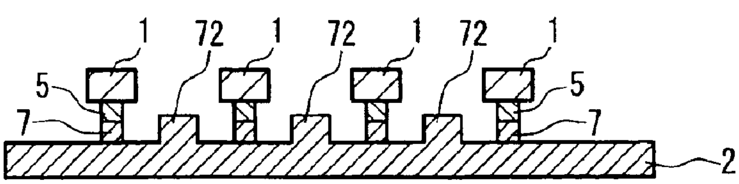
F I G. 2 4 B

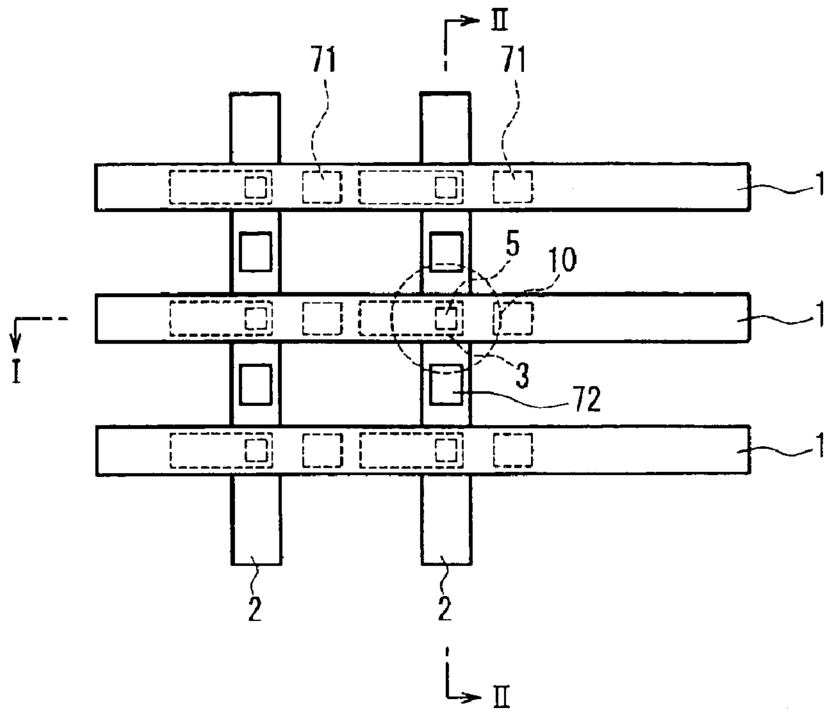
F I G. 25
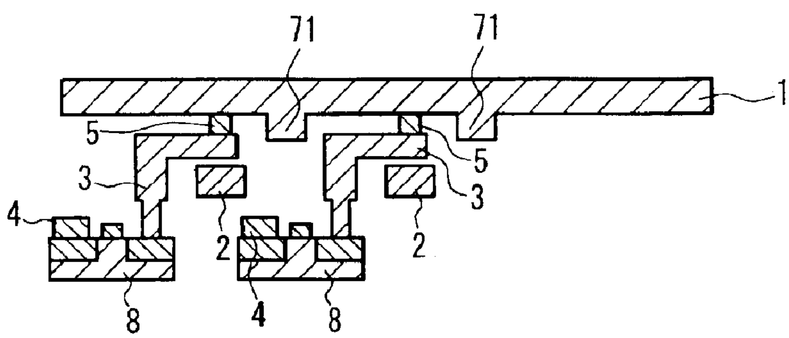
F I G. 26A
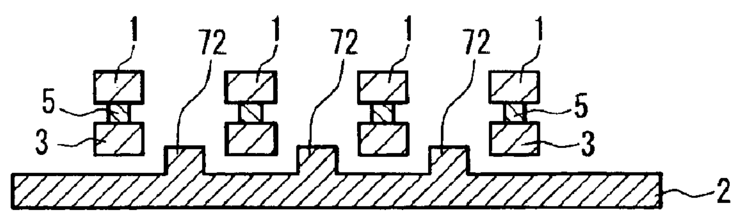
F I G. 26B

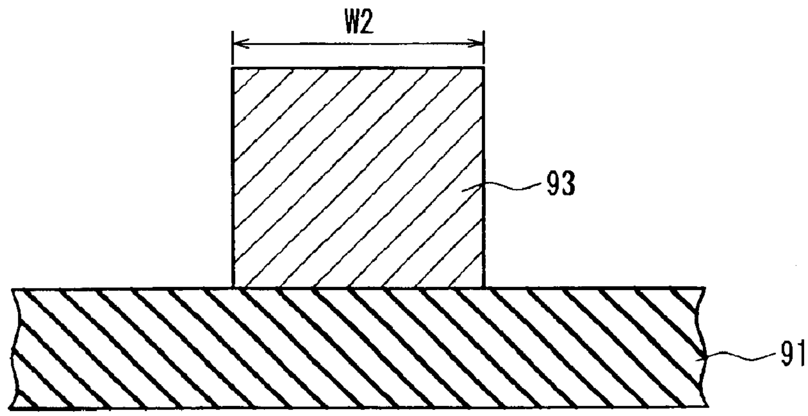
F I G. 2 8 A
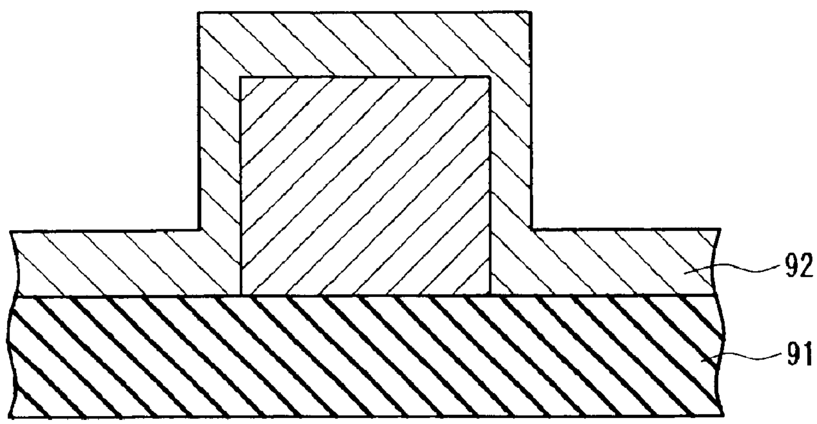
F I G. 2 8 B
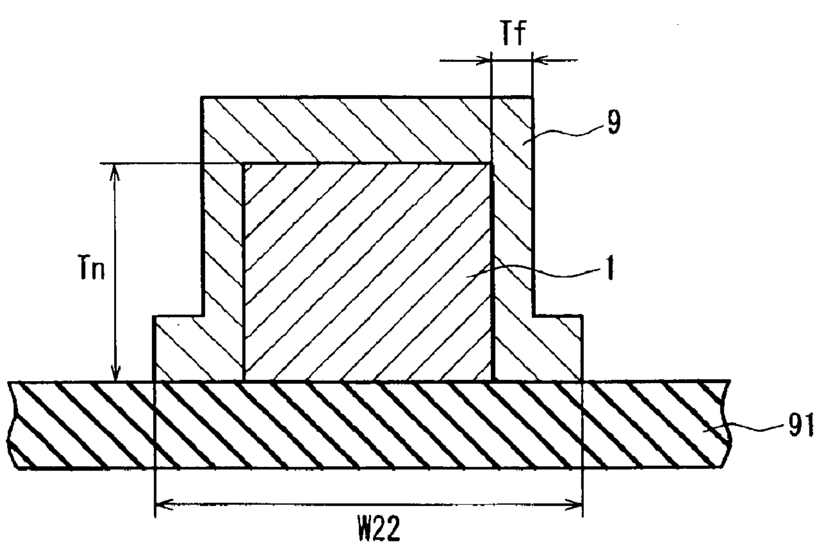
F I G. 2 8 C

MAGNETIC STORAGE ELEMENT, PRODUCTION METHOD AND DRIVING METHOD THEREFOR, AND MEMORY ARRAY

TECHNICAL FIELD

The present invention relates to a magnetic memory device and a manufacturing method and a driving method for the magnetic memory device. The present invention also relates to a memory array that includes a plurality of magnetic memory devices arranged in an array.

BACKGROUND ART

In recent years, a ferromagnetic tunnel junction element has been the focus of attention because of its potentially high MR ratio. Thus, it has been developed actively for applications to devices such as a magnetic head and a magnetic random access memory (MRAM). When used as a memory, the element allows information to be written by changing the magnetization direction of at least one of the ferromagnetic materials that constitute a ferromagnetic tunnel junction and allows the information to be read by detecting a change in resistance resulting from the change in magnetization direction.

To meet the demand for mass storage, the element and conductive wires for writing/reading should be reduced to submicron in size. It is expected that further progress in miniaturization will increase a magnetic field required to change the magnetization direction of the ferromagnetic material. However, there is a limit to the current flowing through the miniaturized conductive wires. Therefore, it is necessary to apply a magnetic field efficiently to a magnetoresistive element.

U.S. Pat. No. 5,659,499 proposes the use of a magnetic member placed around conductive wires for the application of a magnetic field to a magnetoresistive element. However, this configuration fails to consider the fact that the size of the ferromagnetic member also is restricted by miniaturization of the element. In particular, when the ferromagnetic member is placed along a conductive wire whose width is restricted, the shape anisotropy, e.g., in the direction of drawing of the conductive wire prevents the efficient application of a magnetic field.

It is favorable that the conductive wires for writing are located closer to the magnetoresistive element to apply a magnetic field efficiently because the magnetic field is attenuated with the square of the distance. When a three-terminal element such as a MOS transistor is used as a switching element of the memory, an extraction conductive wire is needed to connect the magnetoresistive element and the switching element. Therefore, one of the conductive wires for writing has to apply a magnetic field to the element from beyond this extraction conductive wire. When a diode is used as a switching element and placed between the magnetoresistive element and the conductive wire for writing and reading, this conductive wire also has to apply a magnetic field to the element from beyond the switching element.

Another problem to be solved for the achievement of mass storage is crosstalk due to high integration of an element. The crosstalk causes malfunction or the like of elements that are adjacent to the element to which a magnetic field should be applied.

DISCLOSURE OF INVENTION

It is an object of the present invention to provide a magnetic memory device that is advantageous in achieving mass storage, a manufacturing method and a driving method for the magnetic memory device, and a memory array including the magnetic memory device.

A first magnetic memory device of the present invention includes the following: a magnetoresistive element; a conductive wire for generating magnetic flux that changes a resistance value of the magnetoresistive element; and at least one ferromagnetic member through which the magnetic flux passes. The at least one ferromagnetic member forms a magnetic gap at a position where the magnetic flux passes through the magnetoresistive element. The ferromagnetic member is arranged so that the following relationships are established: a) $Ml \leqq 2Lg$; b) at least one selected from $Lw/Ly \leqq 5$ and $Ly/Lt \geqq 5$; and c) $Ly \leqq 1.0\ \mu m$, where Ml is a length of the magnetoresistive element that is measured in a direction parallel to the magnetic gap, Lg is a length of the magnetic gap, Lt is a thickness of the ferromagnetic member, Lw is a length of the ferromagnetic member in the direction of drawing of the conductive wire, and Ly is a length of a path traced by the magnetic flux in the ferromagnetic member. Ly may change, e.g., depending on the position at which the magnetic flux passes through the ferromagnetic member. In this case, an average length should be employed. When Lt differs depending on the member or the part of the ferromagnetic member, the thickness of the member or the part that forms the magnetic gap can be employed. Since leakage flux may occur in the region where Lt varies, it is preferable that the thickness of the ferromagnetic member is in the range of 0.5Lt to 2Lt. Ml also can be referred to as a length of the magnetoresistive element that is projected onto Lg.

By satisfying the relationship a), a magnetic coupling between the ferromagnetic member and the magnetoresistive element can be made efficiently. In view of this, $Ml \leqq Lg$ is more preferable. Both $Lw/Ly \leqq 5$ and $Ly/Lt \geqq 5$ in the relationship b) are the conditions that allow the magnetization direction of the ferromagnetic member to orient easily toward the magnetoresistive element, even if miniaturization is advanced. Though at least one of the two relationships should be established, it is preferable that both of them are established. A Lw/Ly of 3 or less ($Lw/Ly \leqq 3$) is more preferable. When the relationship c) is given by $Ly \leqq 0.6\ \mu m$, it is preferable that the ferromagnetic member is arranged so as to satisfy $Ml \leqq Lg$ and $Lw/Ly \leqq 3$. When $Ly \leqq 0.5\ \mu m$, it is preferable that the ferromagnetic member is arranged so as to satisfy $Ml \leqq Lg$ and $Ly/Lt \leqq 5$.

Preferred examples of the shape of the ferromagnetic member include a substantially U shape and a substantially inverted U shape (which may be simply referred to as "substantially U shape" in the following). This ferromagnetic member forms a magnetic yoke by itself. The magnetic yoke has a magnetic gap that corresponds to the opening of the substantially U shape. When the ferromagnetic member forms the magnetic yoke, the conductive wire is arranged preferably inside the magnetic yoke (i.e., inside the U shape). However, it is not necessary to use the ferromagnetic member for the entire magnetic yoke. The ferromagnetic member may be arranged in at least a portion of a path (magnetic path) of the magnetic flux passing through the magnetoresistive element. The ferromagnetic member can be divided into two or more parts. The ferromagnetic member can be placed away from the conductive wire, but preferably in contact with the conductive wire.

A second magnetic memory device of the present invention includes the following: a magnetoresistive element; and a first conductive wire and a second conductive wire for generating magnetic flux that changes a resistance value of the magnetoresistive element. The first conductive wire and the second conductive wire are arranged so as to sandwich the magnetoresistive element. An insulator placed between these conductive wires includes a ferromagnetic insulator.

Like the first magnetic memory device, the second magnetic memory device can apply a magnetic field efficiently to the magnetoresistive element, even if miniaturization is advanced. To achieve more efficient application of the magnetic field, the ferromagnetic insulator preferably is in contact with the magnetoresistive element, and more preferably it covers the element.

In the first and the second magnetic memory device, the first conductive wire and the second conductive wire that sandwich the magnetoresistive element may be used as the conductive wires for generating magnetic flux that changes a resistance value of the magnetoresistive element, i.e., a magnetic field for rewriting the memory. In this case, it is preferable that the first conductive wire is connected electrically to the magnetoresistive element, and a switching element or an extraction conductive wire (a third conductive wire) from the switching element is placed between the second conductive wire and the magnetoresistive element.

A third magnetic memory device of the present invention includes the following: a magnetoresistive element; a switching element; a first conductive wire and a second conductive wire for generating magnetic flux that changes a resistance value of the magnetoresistive element; and a third conductive wire for electrically connecting the magnetoresistive element and the switching element. The first conductive wire and the third conductive wire are connected electrically to the magnetoresistive element with the element sandwiched therebetween so as to supply current flowing through the element. A connection of the third conductive wire to the magnetoresistive element is placed between the magnetoresistive element and the second conductive wire. The second conductive wire is insulated electrically from the magnetoresistive element. An angle between the direction of extraction of the third conductive wire from the connection and the direction of drawing of the second conductive wire is 45° or less.

In a conventional configuration, a magnetic field applied to the magnetoresistive element from the second conductive wire is shielded by the third conductive wire in the vicinity of the connection to the magnetoresistive element. The third magnetic memory device of the present invention can suppress the shield effect of the third conductive wire, thus achieving the efficient application of a magnetic field to the magnetoresistive element.

The third magnetic memory device may have the characteristics of the first and the second magnetic memory device. Specifically, the third magnetic memory device further can include at least one ferromagnetic member through which the magnetic flux passes, and the at least one ferromagnetic member forms a magnetic gap at a position where the magnetic flux passes through the magnetoresistive element. In this case, it is preferable that the above relationships a), b) and c) are established. The ferromagnetic member may form, e.g., a substantially U-shaped magnetic yoke. The first conductive wire, the second conductive wire, or the third conductive wire may be arranged inside this magnetic yoke, thereby increasing the effect of the ferromagnetic member. For the same reason, it is preferable that the ferromagnetic member is in contact with at least one selected from the first conductive wire, the second conductive wire, and the third conductive wire. In the case of the third conductive wire, it is preferable that the ferromagnetic member comes into contact with any side surfaces of the third conductive wire, particularly both side surfaces thereof. The side surfaces of the third conductive wire also can be referred to as any of the surfaces that is neither a contact surface with the magnetoresistive element nor the opposite surface to the contact surface. In particular, when the ferromagnetic member is arranged so as to hold at least both side surfaces of the third conductive wire, a magnetic field can be applied more efficiently to the magnetoresistive element.

In the third magnetic memory device, an insulator placed between the first conductive wire and the second conductive wire may include a ferromagnetic insulator. For the same reason described above, the ferromagnetic insulator preferably is in contact with the magnetoresistive element, and more preferably it covers the element.

The present invention also provides a suitable method for driving a magnetic memory device in which a switching element or an extraction electrode (third conductive wire) connected to the switching element is placed between a first conductive wire and a second conductive wire. The driving method of the present invention includes: changing a resistance value of the magnetoresistive element by magnetic fluxes generated from the first conductive wire and the second conductive wire; and applying a current pulse to the second conductive wire for a longer time than to the first conductive wire.

When the switching element or the third conductive wire, particularly the latter, is placed between the second conductive wire and the magnetoresistive element, it takes a long time to respond to the magnetic field applied by the second conductive wire. The driving method of the present invention can adjust pulse durations, thereby achieving the efficient application of a pulse magnetic field to the magnetoresistive element.

In general, it is easier to control a voltage for a semiconductor circuit. Therefore, a conventional circuit also can be used in driving the magnetic memory device with pulses obtained by voltage control. In such a case, the pulse application time may be adjusted so that the waveform of the current generated by the voltage pulse satisfies the above conditions.

The present invention also provides a suitable method for manufacturing the first magnetic memory device in the preferred embodiment, i.e., the conductive wire is arranged inside the ferromagnetic yoke. A first manufacturing method of the present invention includes: forming a concavity in an insulator, the concavity having a depth D1 and a longitudinal direction parallel to the direction of drawing of the conductive wire; forming a ferromagnetic member along the surface of the concavity so that the thickness of the ferromagnetic member at each of the side surfaces of the concavity is Tf; and forming the conductive wire on the surface of the ferromagnetic member in the concavity so that the thickness of the conductive wire is Tn. D1, Tf, and Tn satisfy the following relationships: $Tf \leqq 0.33D1$ and $Tn \geqq D1-1.5Tf$.

This manufacturing method is suitable for a magnetic memory device that satisfies $Ly/Lt \geqq 5$ as the relationship b). $Tf \leqq 0.2D1$ is preferred. It is preferable that the manufacturing method further includes restricting the length of the ferromagnetic member in the direction of drawing of the conductive wire to L1. L1 satisfies the following relationship: $L1 \leqq 5\,(W1+2D1)$, where W1 is the width of the concavity in the short side direction.

This preferred manufacturing method is suitable for a magnetic memory device that satisfies $Lw/Ly \geqq 5$ as well as $Ly/Lt \geqq 5$ as the relationship b).

A second manufacturing method of the present invention includes: forming the conductive wire having a thickness Tn on an insulator; and forming a ferromagnetic member along the surface of the conductive wire so that the thickness of the ferromagnetic member at each of the side surfaces of the conductive wire is Tf. Tf and Tn satisfy the following relationship: $Tf \leqq Tn$.

This manufacturing method is suitable for a magnetic memory device that satisfies $Ly/Lt \geqq 5$ as the relationship b). It is preferable that the manufacturing method further includes restricting the total width of the conductive wire and the ferromagnetic member to W22 after forming the ferromagnetic member. W22 satisfies the following relationship: $(W2+2Tf) \leqq W22 \leqq 1.2\ (W2+2Tf)$, where W2 is the width of the conductive wire. W22 is the total length of the conductive wire and the ferromagnetic member that are in contact with the surface of the ferromagnetic member in the direction perpendicular to the direction of drawing of the conductive wire.

It is preferable that the second manufacturing method of the present invention further includes restricting the length of the ferromagnetic member in the direction of drawing of the conductive wire to L1. L1 satisfies the following relationship: $L1 \leqq 5\ (W2+2\ (Tn+Tf))$, where W2 is the width of the conductive wire.

This preferred manufacturing method is suitable for a magnetic memory device that satisfies $Lw/Ly \leqq 5$ as well as $Ly/Lt \geqq 5$ as the relationship b).

The present invention also provides a memory array that includes a plurality of magnetoresistive elements arranged in an array. The magnetoresistive elements include any one of the first to the third magnetoresistive element.

The present invention also provides a memory array that includes a plurality of magnetoresistive elements arranged in matrix form and a plurality of conductive wires for changing resistance values of the magnetoresistive elements. The conductive wires extend in a predetermined direction. The memory array further includes a group of grounding conductive wires that are arranged between the conductive wires so as to extend in the predetermined direction.

This memory array can reduce crosstalk by the grounding conductive wires.

It is preferable that the above memory array further includes a group of second conductive wires for changing resistance values of the magnetoresistive elements, where the conductive wires are identified by a group of first conductive wires that extend in a first direction; a plane including the first conductive wires and a plane including the second conductive wires sandwich a plane including the magnetoresistive elements; the second conductive wires extend in a second direction (e.g., the direction perpendicular to the first direction); and the memory array further includes a group of grounding conductive wires that are arranged between the second conductive wires so as to extend in the second direction.

The present invention also provides a memory array that includes a plurality of magnetoresistive elements arranged in matrix form and a plurality of conductive wires for changing resistance values of the magnetoresistive elements. At least one conductive wire of the conductive wires is provided with projections that are oriented toward a plane formed by the magnetoresistive elements.

This memory array can reduce crosstalk by the projections. Moreover, the conductive wires are lined with the projections, thus suppressing an increase in resistance of the conductive wires that results from miniaturization. Further, the projections enable the application of a magnetic field that is wound around the device. Therefore, the projections also are useful in applying a magnetic field to the device efficiently.

It is preferable that this memory array further includes a group of second conductive wires for changing resistance values of the magnetoresistive elements, where the conductive wires are identified by a group of first conductive wires; a plane including the first conductive wires and a plane including the second conductive wires sandwich a plane including the magnetoresistive elements; and at least one conductive wire of the second conductive wires is provided with projections that are oriented toward a plane formed by the magnetoresistive elements.

BRIEF DESCRIPTION OF DRAWINGS

FIG. 1 is a plan view showing an example of a memory array in which magnetic memory devices are arranged in an array.

FIG. 2 is a cross-sectional view showing the memory array in FIG. 1.

FIG. 3 is a perspective view showing an example of a first magnetic memory device of the present invention.

FIG. 4 is a cross-sectional view showing a conductive wire of the magnetic memory device in FIG. 3.

FIG. 5 is a plan view showing another example of a memory array in which magnetic memory devices are arranged in an array.

FIG. 6 is a cross-sectional view showing the memory array in FIG. 5.

FIG. 7 is a perspective view showing another example of a first magnetic memory device of the present invention.

FIGS. 9A to 9H are cross-sectional views, each of which shows an example of the configuration of a magnetoresistive element.

FIG. 12 is a plan view showing an example of a memory array in which third magnetic memory devices of the present invention are arranged in an array.

FIG. 13 is a cross-sectional view of the memory array in FIG. 12.

FIG. 14 is a perspective view showing an example of a third magnetic memory device of the present invention that further includes a ferromagnetic member.

FIGS. 15A and 15B are cross-sectional views, each of which shows an example of the arrangement of a ferromagnetic member and a third conductive wire (extraction conductive wire) of a third magnetic memory device of the present invention.

FIG. 16 is a plan view showing an angle $\theta$ ($0° \leqq \theta \leqq 90°$) between the direction of extraction of a third conductive wire and a second conductive wire of a third magnetic memory device of the present invention.

FIG. 17 is a plan view of a memory array that illustrates a driving method of the present invention.

FIG. 18 illustrates pulses to be applied in an example of a driving method of the present invention.

FIG. 19 is a plan view showing an example of a memory array of the present invention, in which a group of grounding conductive wires is arranged.

FIG. 20 is a cross-sectional view showing the memory array in FIG. 19.

FIG. 21 is a plan view showing another example of a memory array of the present invention, in which a group of grounding conductive wires is arranged.

FIG. 22 is a cross-sectional view showing the memory array in FIG. 21.

FIG. 23 is a plan view showing an example of a memory array of the present invention, in which a group of conductive wires having convexities is arranged.

FIGS. 24A and 24B are cross-sectional views showing the memory array in FIG. 23. FIG. 24A is a cross section taken along the line I—I, and FIG. 24B is a cross section taken along the line II—II.

FIG. 25 is a plan view showing another example of a memory array of the present invention, in which a group of conductive wires having convexities are arranged.

FIGS. 26A and 26B are cross-sectional views showing the memory array in FIG. 25. FIG. 26A is a cross section taken along the line I—I, and FIG. 26B is a cross section taken along the line II—II.

FIGS. 28A to 28C are cross-sectional views showing another example of a manufacturing method of the present invention.

EMBODIMENTS OF THE INVENTION

Hereinafter, embodiments of the present invention will be described.

A magnetic memory device of the present invention can be produced by forming a multi-layer film on a substrate. As the substrate, an article with an insulated surface, e.g., a Si substrate with thermal oxidation, a quartz substrate, and a sapphire substrate can be used. To smooth the substrate surface, a smoothing process, e.g., chemomechanical polishing (CMP) may be performed as needed. A substrate provided with a switching element such as a MOS transistor also can be used.

The multi-layer film can be formed with a general thin film producing method, e.g., sputtering, molecular beam epitaxy (MBE), chemical vapor deposition (CVD), pulse laser deposition, and ion beam sputtering. As a micro-processing method, well-known micro-processing methods, such as photolithography using a contact mask or stepper, electron beam (EB) lithography and focused ion beam (FIB) processing, may be employed.

For etching, e.g., ion milling and reactive ion etching (RIE) may be employed. A well-known etching method can be used in the ion milling and the RIE. CMP or precision lapping can be used to smooth the surface and to remove a portion of the film.

If necessary, the multi-layer film may be heat-treated in a vacuum, inert gas, or hydrogen, with or without application of a magnetic field.

There is no particular limitation to a material for each member, and well-known materials can be used. It is preferable that a material for a conductive wire has an electric resistivity of 3 $\mu\Omega$cm or less. Specifically, a suitable material for the conductive wire can be at least one conductor selected from Al, Ag, Au, Cu and Si, an alloy including at least one selected from these conductors as the main component, or $B_4C$. Here, the main component is referred to as a component that accounts for 50 wt % or more. The material having a small electric resistivity is useful for the efficient application of a magnetic field.

Before explaining each of the embodiments of the present invention, an example of a first manufacturing method of the present invention will be described by referring to FIGS. 27A to 27C. The first manufacturing method also can be applied to each of the embodiments.

Figure 27A:
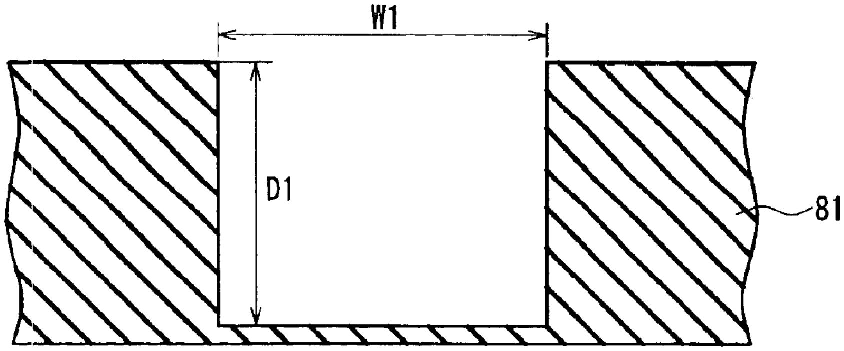
FIGS. 27A to 27C are cross-sectional views showing an example of a manufacturing method of the present invention.
Figure 27B:
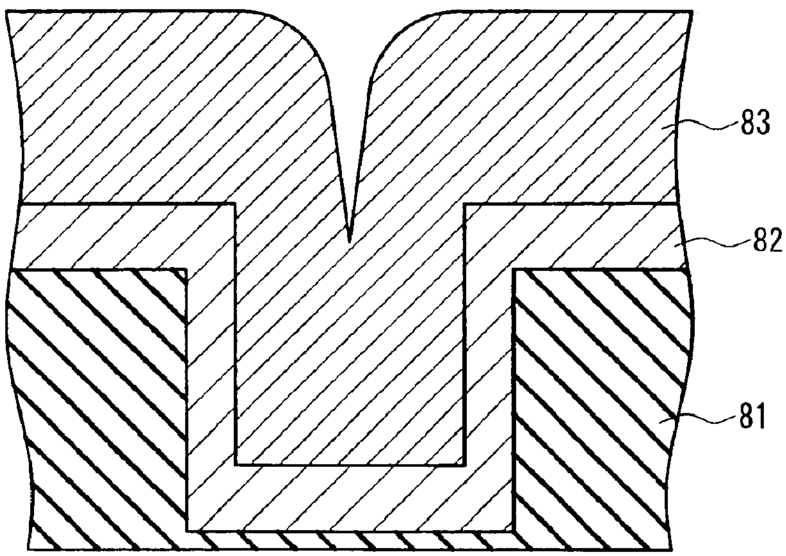
Figure 27C:
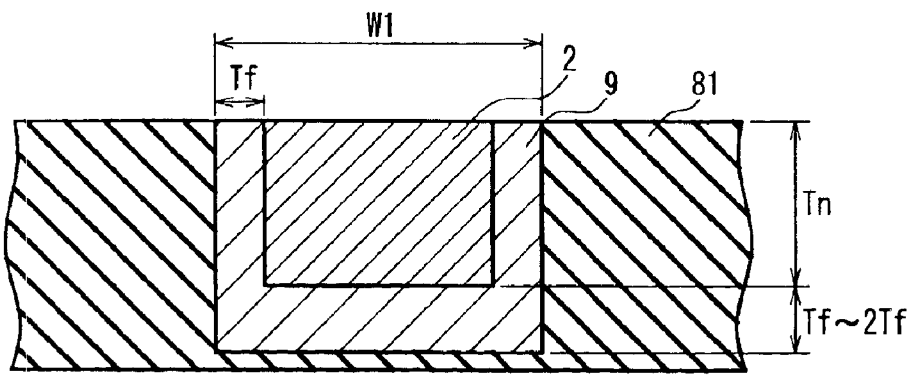

A trench having a width (a length in a short side direction) W1 and a depth D1 is formed in an insulator 81 that serves as an interlayer insulating film (FIG. 27A). A ferromagnetic member 82 and a non-magnetic conductor 83 are formed in the region including the inside of the trench (FIG. 27B). The ferromagnetic member 82 has a thickness Tf that is measured from each of the side surfaces of the trench in the short side direction. Any unnecessary film is removed, e.g., by polishing (FIG. 27C). Consequently, a conductive wire 2 having a thickness Tn can be arranged inside a substantially U-shaped ferromagnetic yoke 9. When a film is formed in the trench, the thickness at the bottom of the trench may be one to two times the thickness Tf at the side surfaces of the trench. This manufacturing method can achieve the preferred embodiment while taking into account the film thickness that differs from part to part.

Next, an example of a second manufacturing method of the present invention will be described by referring to FIGS. 28A to 28C. A non-magnetic conductor 93 having a width (a length in a short side direction) W2 is formed on an insulator 91 that serves as an interlayer insulating film (FIG. 28A). A ferromagnetic member 92 is formed so as to cover the conductor (FIG. 28B). The ferromagnetic member 92 has a thickness Tf that is measured from each of the side surfaces of the conductor in the short side direction. Any unnecessary film is removed by polishing, photolithography, or the like. (FIG. 28C).

It is preferable that a width W22 of the ferromagnetic member (the whole width including a conductive wire) is not less than (W2+2Tf). This makes it possible to suppress Tf variations caused by photolithography. On the other hand, it is preferable that W22 is not more than 1.2 (W2+2Tf). This is because the presence of the excess ferromagnetic member in the vicinity of a magnetic gap can disturb the magnetic flux near the gap.

Consequently, a conductive wire 1 can be arranged inside a substantially inverted U-shaped ferromagnetic yoke 9. This manufacturing method also takes into account the film thickness that differs from part to part.

In the methods shown in FIGS. 27A to 27C and FIGS. 28A to 28C, the length, width, etc. of each member can be controlled by forming a resist mask, etching, milling or the like.

Unless otherwise stated, a value expressed by nm is a film thickness.

Embodiment 1

This embodiment describes an example of a memory array including first magnetic memory devices.

First, a method for producing a magnetic memory device that does not use a ferromagnetic member for the application of a magnetic field is described as a conventional example 1. A 500 nm thermal oxide film is formed on a Si single crystal wafer, on which Cu is deposited as an underlying electrode by RF magnetron sputtering, followed by a 2 nm Pt film. Then, a 10 nm Si film is formed by pulse laser deposition, and the Si film is doped with Al by ion implantation. Further, a 5 nm Si film is formed, and the Si film is doped with P by ion implantation. Thus, a diode is fabricated as a switching element.

Subsequently, Ta (5 nm), NiFe (3 nm), PtMn (30 nm), CoFe (3 nm), Ru (0.7 nm), CoFe (3 nm), AlOx (1.2 nm), and NiFe (4 nm) are deposited in the order mentioned by RF magnetron sputtering. The AlOx ($x \leqq 1.5$) is prepared by forming an Al film and oxidizing the Al film. These films constitute a spin-valve type magnetoresistive element, in which the AlOx is a tunnel layer, the CoFe is a pinned magnetic layer, and the NiFe is a free magnetic layer.

Lines and spaces are patterned by photolithography on the multi-layer film thus produced, and the space between the lines is etched down to the thermal oxide film by RIE and Ar ion milling. Then, a mesa-patterned resist is formed on the lines so that each mesa is a substantially rectangular parallelepiped in shape and arranged at regular intervals by photolithography or EB lithography for smaller size. Again, the multi-layer film is etched down to the Pt of the underlying electrode by Ar ion milling and RIE. Further, $Al_2O_3$ is deposited by ion beam deposition without removing the resist. The resist and the $Al_2O_3$ formed on the resist are removed with a remover (which is so-called lift-off). Thus, contact holes are provided in the surface of the device.

On top of that, Cu is deposited as an upper electrode by RF magnetron sputtering. Lines and spaces are patterned again by photolithography on the contact holes in a direction substantially perpendicular to the underlying electrode. Then, the upper electrode placed in the space between the lines is etched by Ar ion milling. To protect the device, a 10 nm $Al_2O_3$ film is formed on the region other than a contact pad portion.

Moreover, the device is heat-treated in a vacuum at 240° C. for 3 hours while applying a magnetic field of 5 kOe (398 kA/m) in a direction parallel to the direction of drawing of the underlying electrode so as to impart unidirectional anisotropy to the antiferromagnetic layer (PtMn).

Next, a magnetic memory device including magnetic members that are arranged over the entire length of conductive wires is described as a conventional example 2.

An 800 nm thermal oxide film is formed on a Si single crystal wafer, on which lines and spaces are patterned by photolithography. Then, trenches that extend along the lines are formed in the thermal oxide film (Si oxide film) by RIE. NiFe and Cu are deposited in the trenches by magnetron sputtering, and the excess NiFe and Cu are removed by CMP (which is so-called Damascene).

On top of that, films are formed in the same manner as the conventional example 1 until an upper electrode is fabricated. Before forming a $Al_2O_3$ film to protect the device, NiFe is deposited. Then, lines and spaces are patterned by photolithography on the upper electrode in a self-aligned fashion. The excess NiFe except for that covering the upper electrode is removed by Ar ion milling. Thereafter, the $Al_2O_3$ film for protecting the device is formed.

The following is an example of a magnetic memory device including magnetic members whose length is restricted in the wiring direction.

After NiFe is deposited in the process of fabricating the underlying electrode of the conventional example 2, a resist pattern is formed in a direction perpendicular to the direction in which the trenches extend. Then, the NiFe is removed by Ar ion milling, Cu is deposited, and CMP is performed, thereby restricting the length of a NiFe ferromagnetic yoke. In the process of fabricating the upper electrode, the patterning size of photolithography after the deposition of NiFe is restricted in the longitudinal direction of a convexity, thereby restricting the length of a ferromagnetic yoke of the upper electrode. The other portions are formed in the same manner as the conventional example 2, thus providing a magnetic memory device.

Each memory array thus produced has a configuration shown in FIGS. 1 and 2. Magnetoresistive elements 5 are arranged at the intersections of first conductive wires (upper electrodes) 1 and second conductive wires (lower electrodes) 2 to form a matrix. Each of the elements 5 is connected to the lower electrode 2 via a switching element (diode) 7. A magnetic memory device 10 includes the first conductive wire 1 and the second conductive wire 2 that extend in the direction perpendicular to each other, and the magnetoresistive element 5 and the switching element 7 that are placed in sequence between these conductive wires.

FIGS. 3 and 4 show a magnetic memory device including a magnetic member whose length is restricted. In this device, a ferromagnetic yoke 9 is placed around each of a first conductive wire 1 and a second conductive wire 2. The length of this yoke in the wiring direction is restricted to Lw. The ferromagnetic yoke 9 has a magnetic gap Lg, a thickness Lt, and a magnetic path length Ly. Specifically, as shown in FIG. 4, the magnetic path length Ly represents the length of a path traced by the magnetic flux along the center of the thickness of the ferromagnetic member, i.e., a mean magnetic path length.

By changing the electrodes (Cu), the ferromagnetic member (NiFe), and the width and the thickness of a trench in the above magnetic memory device, Ly/Lt and Lw/Ly vary with respect to different Ly, Ml, and Lg. For each of the devices thus produced, a current value required to reverse the magnetization of the free magnetic layer of the magnetoresistive element was measured. These current values were equal regardless of the cross-sectional shape of the conductive wires or the yoke, as long as the magnetic memory devices had the same relationship between Ml, Lg, Lt, Lw, and Ly. Compared with the conventional example 1, the current needed for magnetization reversal was reduced in all the devices. Table 1 shows the results.

TABLE 1

(μm)

| Ly = 2 | Lg = 0.7 M1 = 2<br>Lw | | | | |
|---|---|---|---|---|---|
| Ly/Lt | 2 | 3 | 5 | 6 | 100 |
| 4 | F | F | F | Z | Z |
| 5 | F | F | F | Z | Z |
| 10 | F | F | F | F | Z |

| Ly = 2 | Lg = 0.7 M1 = 1.4<br>Lw | | | | |
|---|---|---|---|---|---|
| Ly/Lt | 2 | 3 | 5 | 6 | 100 |
| 4 | F | F | F | F | ※ |
| 5 | F | F | F | F | F |
| 10 | F | F | F | F | F |

TABLE 1-continued

| Ly = 2 | Lg = 0.7 M1 = 0.7 Lw | | | | |
|---|---|---|---|---|---|
| Ly/Lt | 2 | 3 | 5 | 6 | 100 |
| 4 | E | E | E | E | E |
| 5 | E | E | E | E | E |
| 10 | E | E | E | E | E |

| Ly = 1 | Lg = 0.35 M1 = 1 Lw | | | | |
|---|---|---|---|---|---|
| Ly/Lt | 2 | 3 | 5 | 6 | 100 |
| 4 | F | F | Z | Z | Z |
| 5 | F | F | F | Z | Z |
| 10 | F | F | F | Z | Z |

| Ly = 1 | Lg = 0.35 M1 = 0.7 Lw | | | | |
|---|---|---|---|---|---|
| Ly/Lt | 2 | 3 | 5 | 6 | 100 |
| 4 | E | E | E | F | ※ |
| 5 | D | D | D | E | E |
| 10 | D | D | D | E | E |

| Ly = 1 | Lg = 0.35 M1 = 0.35 Lw | | | | |
|---|---|---|---|---|---|
| Ly/Lt | 2 | 3 | 5 | 6 | 100 |
| 4 | D | D | D | E | E |
| 5 | C | C | C | D | D |
| 10 | C | C | C | D | D |

| Ly = 0.6 | Lg = 0.2 M1 = 0.6 Lw | | | | |
|---|---|---|---|---|---|
| Ly/Lt | 2 | 3 | 5 | 6 | 100 |
| 4 | F | Z | Z | Z | Z |
| 5 | F | F | Z | Z | Z |
| 10 | F | F | Z | Z | Z |

| Ly = 0.6 | Lg = 0.2 M1 = 0.4 Lw | | | | |
|---|---|---|---|---|---|
| Ly/Lt | 2 | 3 | 5 | 6 | 100 |
| 4 | D | D | E | F | ※ |
| 5 | C | C | D | E | E |
| 10 | C | C | D | E | E |

| Ly = 0.6 | Lg = 0.2 M1 = 0.2 Lw | | | | |
|---|---|---|---|---|---|
| Ly/Lt | 2 | 3 | 5 | 6 | 100 |
| 4 | D | D | D | E | E |
| 5 | C | C | C | D | D |
| 10 | C | C | C | D | D |

| Ly = 0.5 | Lg = 0.18 M1 = 0.5 Lw | | | | |
|---|---|---|---|---|---|
| Ly/Lt | 2 | 3 | 5 | 6 | 100 |
| 4 | Z | Z | Z | Z | Z |
| 5 | F | Z | Z | Z | Z |
| 10 | F | Z | Z | Z | Z |

TABLE 1-continued

| Ly = 0.5 | Lg = 0.18 M1 = 0.35 Lw | | | | |
|---|---|---|---|---|---|
| Ly/Lt | 2 | 3 | 5 | 6 | 100 |
| 4 | D | D | E | F | ※ |
| 5 | C | C | D | E | E |
| 10 | C | C | D | E | E |

| Ly = 0.5 | Lg = 0.18 M1 = 0.18 Lw | | | | |
|---|---|---|---|---|---|
| Ly/Lt | 2 | 3 | 5 | 6 | 100 |
| 4 | C | C | D | E | E |
| 5 | A | B | B | C | C |
| 10 | A | A | B | C | C |

| Ly = 0.3 | Lg = 0.1 M1 = 0.3 Lw | | | | |
|---|---|---|---|---|---|
| Ly/Lt | 2 | 3 | 5 | 6 | 100 |
| 4 | Z | Z | Z | Z | Z |
| 5 | Z | Z | Z | Z | Z |
| 10 | Z | Z | Z | Z | Z |

| Ly = 0.3 | Lg = 0.1 M1 = 0.2 Lw | | | | |
|---|---|---|---|---|---|
| Ly/Lt | 2 | 3 | 5 | 6 | 100 |
| 4 | D | D | E | F | ※ |
| 5 | C | C | D | E | E |
| 10 | B | C | D | E | E |

| Ly = 0.3 | Lg = 0.1 M1 = 0.1 Lw | | | | |
|---|---|---|---|---|---|
| Ly/Lt | 2 | 3 | 5 | 6 | 100 |
| 4 | C | C | D | E | E |
| 5 | A | A | B | C | C |
| 10 | A | A | B | C | C |

The results shown in Table 1 are evaluated by comparing each device with a reference sample (marked with "※" in Table 1) whose Ly is the same as that of the device: "Z" indicates an increase in current value, "F" indicates a substantially equal current value, "E" indicates a decrease in current value by 10% or less, "D" indicates a decrease of 20% or less, "C" indicates a decrease of 30% or less, "B" indicates a decrease of 40% or less, and "A" indicates a decrease of 50% or less.

When the conductive wires are made of a material other than Cu, e.g., Al, Ag, Au, Si, $B_4C$, $Cu_{98}Si_2$, $Cu_{98}Al_2$, or $Ag_{90}Au_{10}$, the same improvement also can be achieved by the ferromagnetic yoke. These materials can reduce more wiring resistance than Pt or Ta, which in turn reduces power consumption. A reduction in power consumption is useful for the efficient application of a magnetic field.

The ferromagnetic yoke may be fabricated in the following manner: for the underlying electrode, a resist pattern is formed in a trench beforehand in a direction perpendicular to the direction in which the trench extends, and then the unnecessary ferromagnetic member is lifted-off after film deposition. For the upper electrode, the same lift-off process is performed on the non-magnetic conductor that is formed into a convexity.

Even if a nonlinear element, such as a tunnel diode, a Schottky diode and a varistor, is used as the switching element, the same result can be obtained qualitatively.

In this embodiment, the magnetoresistive element has a multi-layer structure of antiferromagnetic material 35/pinned magnetic layer 33 (ferromagnetic material 41/non-magnetic material 42/ferromagnetic material 43)/high-resistance layer 32 (tunnel layer)/free magnetic layer 31 (ferromagnetic material), as shown in FIG. 9E. However, the magnetoresistive element is not limited thereto, and various structures in FIGS. 9A to 9D and 9F can be employed. A laminated ferrimagnetic material including ferromagnetic material 41/non-magnetic material 42/ferromagnetic material 43 may be used as the free magnetic layer 31 (FIGS. 9B and 9G).

Figure 8A:
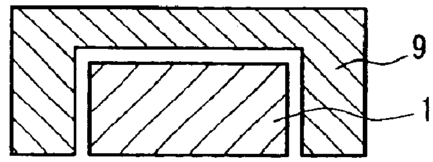
FIGS. 8A to 8G are cross-sectional views, each of which shows an example of the arrangement of a ferromagnetic member.
Figure 8B:
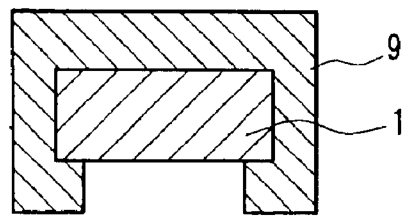
Figure 8C:
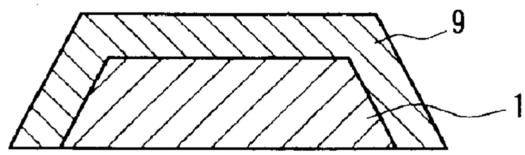
Figure 8D:
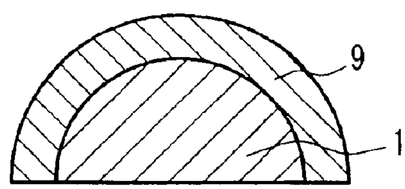
Figure 8E:
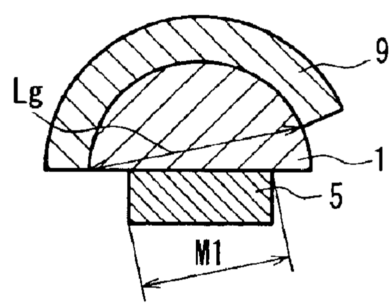
Figure 8F:
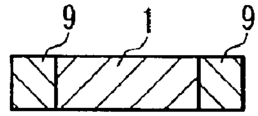
Figure 8G:
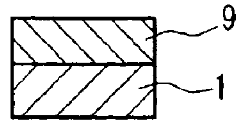

The ferromagnetic yoke is not limited to the shape shown in FIG. 4, and can be in various forms shown in FIGS. 8A to 8G. It is not necessary to bring the yoke 9 into contact with the conductive wire 1 (FIG. 8A). When the magnetic gap tilts with respect to the surface on which the magnetoresistive element is formed (FIG. 8E), the length Ml of the element is measured parallel to the length Lg of the magnetic gap. The ferromagnetic member does not need to have a substantially U shape (FIGS. 8A to 8E), and can be arranged so as to form a portion of the substantially U shape (FIGS. 8F and 8G). It is only necessary that the ferromagnetic member be arranged so as to form a magnetic gap at the position where the magnetic flux generated by the conductive wire passes through. The magnetic flux flowing out of the magnetic gap passes through the magnetoresistive element and reverses the magnetization of the free magnetic layer.

Embodiment 2

This embodiment describes a second magnetic memory device.

Here, the conventional example 1 in Embodiment 1 is used as a conventional example.

The following is an example of producing a magnetic memory device that includes a ferromagnetic insulator.

A 500 nm thermal oxide film is formed on a Si single crystal wafer, on which Cu is deposited as an underlying electrode by RF magnetron sputtering, followed by a 2 nm Pt film. Then, a 10 nm Si film is formed by pulse laser deposition, and the Si film is doped with Al by ion implantation. Further, a 5 nm Si film is formed, and the Si film is doped with P by ion implantation. Thus, a diode is fabricated as a switching element.

Subsequently, Ta (5 nm), NiFe (3 nm), PtMn (30 nm), CoFe (3 nm), Ru (0.7 nm), CoFe (3 nm), AlOx (1.2 nm), and NiFe (4 nm) are deposited in the order mentioned by RF magnetron sputtering. The AlOx is prepared by forming an Al film and oxidizing the Al film.

These films constitute a spin-valve type magnetoresistive element, in which the AlOx is a tunnel layer, the CoFe is a pinned magnetic layer, and the NiFe is a free magnetic layer.

Lines and spaces are patterned by photolithography on the multi-layer film thus produced, and the space between the lines is etched down to the thermal oxide film by RIE and Ar ion milling. Then, a mesa-patterned resist is formed on the lines so that each mesa is a substantially rectangular parallelepiped in shape and arranged at regular intervals by photolithography or EB lithography for smaller size. Again, the multi-layer film is etched down to the Pt of the underlying electrode by Ar ion milling and RIE. Further, $Al_2O_3$ is deposited so that it reaches the lower end of the magnetoresistive element by ion beam deposition without removing the resist. Then, YIG (yttrium iron garnet) is deposited to a position slightly higher than the upper end of the magnetoresistive element by laser beam deposition. The resist and the $Al_2O_3$ and the YIG that are formed on the resist are removed with a remover (which is so-called lift-off). Thus, contact holes are provided in the surface of the device.

On top of that, Cu is deposited as an upper electrode by RF magnetron sputtering. Lines and spaces are patterned again by photolithography on the contact holes in a direction substantially perpendicular to the underlying electrode. Then, the upper electrode placed in the space between the lines is etched by Ar ion milling. To protect the device, a 10 nm $Al_2O_3$ film is formed on the region other than a contact pad portion.

Moreover, the device is heat-treated in a vacuum at 240° C. for 3 hours while applying a magnetic field of 5 kOe in a direction parallel to the direction of drawing of the underlying electrode so as to impart unidirectional anisotropy to the antiferromagnetic layer (PtMn).

Figure 10:
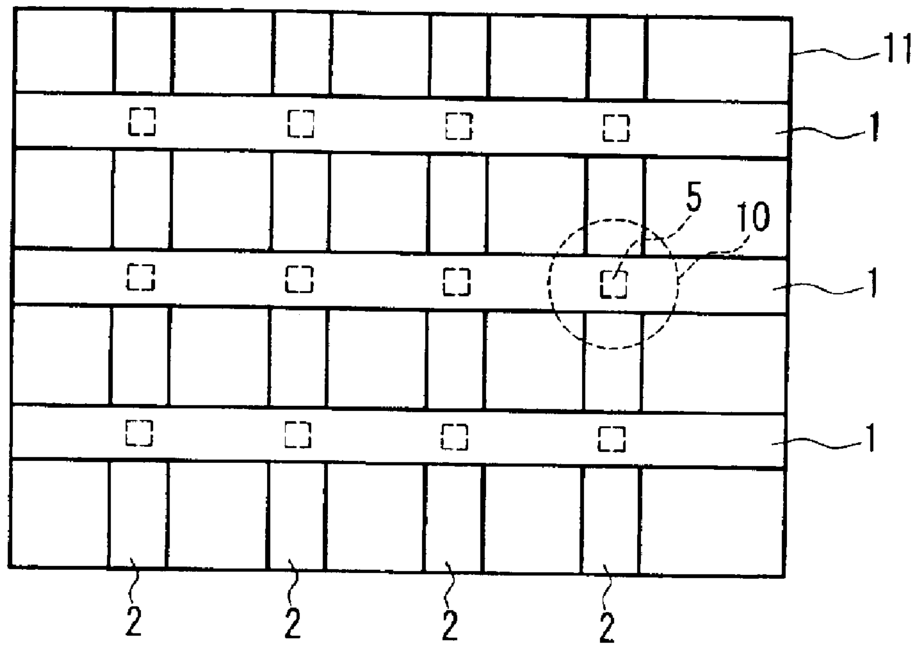
FIG. 10 is a plan view showing an example of a memory array in which second magnetic memory devices of the present invention are arranged in an array.
Figure 11:
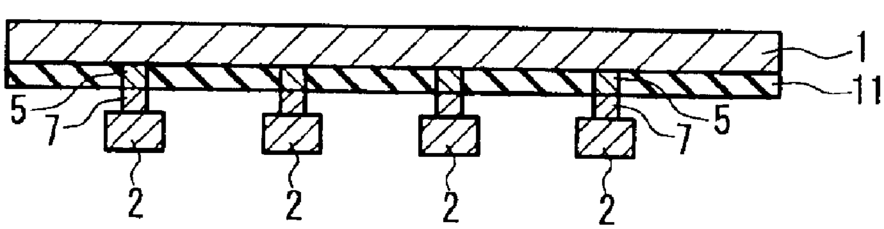
FIG. 11 is a cross-sectional view showing the memory array in FIG. 10.

As shown in FIGS. 10 and 11, this magnetic memory device includes a ferromagnetic insulator (YIG) 11 in an interlayer insulating film between first conductive wires (upper electrodes) 1 and second conductive wires (lower electrodes) 2. As described above, though the interlayer insulating film may include a non-magnetic insulating film ($Al_2O_3$), it is preferable that the ferromagnetic insulator 11 is arranged so as to cover the side surfaces of each magnetoresistive element 5.

Using the same criteria as those in Embodiment 1, a device that includes only $Al_2O_3$ in the interlayer insulating film is compared with a device that uses YIG for the interlayer insulating film around the magnetoresistive elements while changing the device size. The results show that the current needed for magnetization reversal of the free magnetic layer is reduced in the devices including YIG, regardless of the device size.

Instead of YIG, a material obtained by replacing a portion of YIG, Ni ferrite, and a substitution product of the Ni ferrite also can provide the same effect qualitatively. To reduce the current, a ferromagnetic material with high electric resistivity, particularly a soft ferromagnetic material, such as YIG and Ni ferrite, is preferred. The higher the electric resistivity is, the less likely leakage current is to occur, though it depends on the device design. It is preferable that the ferromagnetic insulator has an electric resistivity of 1 kΩcm or more, particularly 10 kΩcm or more.

Embodiment 3

This embodiment describes another example of a memory array including the first magnetic memory devices.

First, a method for producing a magnetic memory device that does not use a ferromagnetic member for the application of a magnetic field is described as a conventional example 3. MOS transistors are formed in a Si wafer beforehand. Al is deposited on the Si wafer as an underlying electrode, and then removed by photolithography and RIE except for the extraction electrodes of a source and a gate and the contact electrode of a drain. On top of that, $SiO_2$ is deposited as an insulating film by CVD, and Cu is deposited on the $SiO_2$ film by sputtering. Lines and spaces are patterned by photolithography, and then etched by ion milling. After removal of the resist, $SiO_2$ is deposited again by CVD, and then smoothed by CMP. Contact holes are provided on the drains of the MOS transistors by photolithography and RIE, Ta is deposited as an underlying layer, and Al is deposited in the contact holes by downflow sputtering. After removal of the excess Al by etching, CuAl is deposited as an underlying layer and Cu is deposited on the CuAl film.

Subsequently, Ta (5 nm), NiFe (3 nm), PtMn (30 nm), CoFe (3 nm), Ru (0.7 nm), CoFe (3 nm), AlOx (1.2 nm), and NiFe (4 nm) are deposited in the order mentioned by RF magnetron sputtering. The AlOx is prepared by forming an Al film and oxidizing the Al film. These films constitute a spin-valve type magnetoresistive element, in which the AlOx is a tunnel layer, the CoFe is a pinned magnetic layer, and the NiFe is a free magnetic layer.

Substantially rectangular parallelepiped patterns are formed by photolithography and ion milling so that each pattern begins on the contact holes and extends above the conductive wires formed under the $SiO_2$ film. Then, substantially rectangular parallelepiped mesa patterns are formed on these patterns, i.e., roughly above the conductive wires formed under the $SiO_2$ film, by photolithography or EB lithography for smaller size. Again, the multi-layer film is etched down near the Cu of the underlying electrode by Ar ion milling. Thereafter, $SiO_2$ is deposited by CVD, and a resist pattern is formed on the $SiO_2$ film by photolithography or EB lithography. Further, contact holes connected to the mesa patterns are provided by RIE. A Ta underlying layer and Al are used in the same manner as that described above to bury a contact electrode in the contact holes. Then, CMP is performed to make the surface even and to control the height of the contact holes.

On top of that, Cu is deposited as an upper electrode by RF magnetron sputtering. Lines and spaces are patterned by photolithography and ion milling on the contact holes in a direction perpendicular to the conductive wires formed under the magnetoresistive elements. Then, the upper electrode placed in the space between the lines is etched by Ar ion milling. To protect the device, a 10 nm $Al_2O_3$ film is formed on the region other than a contact pad portion.

Moreover, the device is heat-treated in a vacuum at 240° C. for 3 hours while applying a magnetic field of 5 kOe in a direction parallel to the direction of drawing of the underlying electrode so as to impart unidirectional anisotropy to the antiferromagnetic layer (PtMn).

Next, a magnetic memory device including magnetic members that are arranged over the entire length of conductive wires is described as a conventional example 4.

After forming an electrode on a semiconductor wafer by the same process as the conventional example 3, $SiO_2$ is deposited by CVD to a thickness larger than that in the conventional example 3. With the same process as that for producing a ferromagnetic yoke and an underlying electrode in the conventional example 2, trenches are formed in the $SiO_2$ film, and then a $Co_{90}Fe_{10}$ ferromagnetic yoke and a Cu conductive wire in the ferromagnetic yoke are formed.

Similarly, the same process as the conventional example 2 is used to form a $Co_{90}Fe_{10}$ ferromagnetic yoke and a Cu conductive wire in the ferromagnetic yoke as an upper electrode. The other portions are formed in the same manner as the conventional example 3, thus providing a magnetic memory device.

The following is an example of a magnetic memory device including magnetic members whose length is restricted in the wiring direction.

After $Co_{90}Fe_{10}$ is deposited in the process of fabricating the underlying electrode of the conventional example 4, a resist pattern is formed in a direction perpendicular to the direction in which the trenches extend. Then, the $Co_{90}Fe_{10}$ is removed by Ar ion milling, Cu is deposited, and CMP is performed, thereby restricting the length of a $Co_{90}Fe_{10}$ ferromagnetic yoke. In the process of fabricating the upper electrode, the patterning size of photolithography after the deposition of $Co_{90}Fe_{10}$ is restricted in the longitudinal direction of a convexity, thereby restricting the length of a ferromagnetic yoke of the upper electrode. The other portions are formed in the same manner as the conventional example 4, thus providing a magnetic memory device.

Each memory array thus produced has a configuration shown in FIGS. 5 and 6. Magnetoresistive elements 5 are arranged at the intersections of first conductive wires 1 and second conductive wires 2 to form a matrix. Each of the elements 5 is connected to a switching element (MOS transistor) 8 via a third conductive wire 3. A fourth conductive wire 4 for reading is connected to the switching element. A magnetic memory device 10 includes the following: the first conductive wire 1 and the fourth conductive wire 4; the magnetoresistive element 5 and the switching element 7 that are arranged in series between these conductive wires; the third conductive wire 3 that connects the two elements 5, 8; and the second conductive wire 2 that is insulated from the magnetoresistive element 5 and extends in a direction perpendicular to the first conductive wire 1. The first and the second conductive wire 1, 2 are used to apply a magnetic field to the magnetoresistive element 5. The first conductive wire 1 and the second conductive wire 2 or the fourth conductive wire 4 extend in the direction perpendicular to each other.

As shown in FIG. 7, a ferromagnetic yoke 9 is placed around each of a first conductive wire 1 and a second conductive wire 2. The length of this yoke in the wiring direction is restricted to Lw. The ferromagnetic yoke 9 has a magnetic gap Lg, a thickness Ly, and a magnetic path length Ly, as shown in FIG. 4.

By changing the electrodes (Cu), the ferromagnetic member ($Co_{90}Fe_{10}$), and the width and the thickness of a trench of the above magnetic memory device, Ly/Lt and Lw/Ly vary with respect to different Ly, Ml, and Lg. For each of the devices thus produced, a current value required to reverse the magnetization of the free magnetic layer of the magnetoresistive element was measured. These current values were equal regardless of the cross-sectional shape of the conductive wires or the yoke, as long as the magnetic memory devices had the same relationship between Ml, Lg, Lt, Lw, and Ly. Compared with the conventional example 3, the current needed for magnetization reversal was reduced in all the devices. Table 2 shows the results.

TABLE 2

(μm)

| Ly = 2 | Lg = 0.7 M1 = 2<br>Lw | | | | |
|---|---|---|---|---|---|
| Ly/Lt | 2 | 3 | 5 | 6 | 100 |
| 4 | F | F | F | Z | Z |
| 5 | F | F | F | Z | Z |
| 10 | F | F | F | F | Z |

| Ly = 2 | Lg = 0.7 M1 = 1.4<br>Lw | | | | |
|---|---|---|---|---|---|
| Ly/Lt | 2 | 3 | 5 | 6 | 100 |
| 4 | F | F | F | F | ※ |
| 5 | F | F | F | F | F |
| 10 | F | F | F | F | F |

TABLE 2-continued

| Ly = 2 | Lg = 0.7 M1 = 0.7 Lw | | | | |
|---|---|---|---|---|---|
| Ly/Lt | 2 | 3 | 5 | 6 | 100 |
| 4 | E | E | E | E | E |
| 5 | E | E | E | E | E |
| 10 | E | E | E | E | E |

| Ly = 1 | Lg = 0.35 M1 = 1 Lw | | | | |
|---|---|---|---|---|---|
| Ly/Lt | 2 | 3 | 5 | 6 | 100 |
| 4 | F | F | Z | Z | Z |
| 5 | F | F | F | Z | Z |
| 10 | F | F | F | Z | Z |

| Ly = 1 | Lg = 0.35 M1 = 0.7 Lw | | | | |
|---|---|---|---|---|---|
| Ly/Lt | 2 | 3 | 5 | 6 | 100 |
| 4 | E | E | E | F | X |
| 5 | D | D | D | E | E |
| 10 | D | D | D | E | E |

| Ly = 1 | Lg = 0.35 M1 = 0.35 Lw | | | | |
|---|---|---|---|---|---|
| Ly/Lt | 2 | 3 | 5 | 6 | 100 |
| 4 | D | D | D | E | E |
| 5 | C | C | C | D | D |
| 10 | C | C | C | D | D |

| Ly = 0.6 | Lg = 0.2 M1 = 0.6 Lw | | | | |
|---|---|---|---|---|---|
| Ly/Lt | 2 | 3 | 5 | 6 | 100 |
| 4 | F | Z | Z | Z | Z |
| 5 | F | F | Z | Z | Z |
| 10 | F | F | Z | Z | Z |

| Ly = 0.6 | Lg = 0.2 M1 = 0.4 Lw | | | | |
|---|---|---|---|---|---|
| Ly/Lt | 2 | 3 | 5 | 6 | 100 |
| 4 | D | D | E | F | X |
| 5 | C | C | D | E | E |
| 10 | C | C | D | E | E |

| Ly = 0.6 | Lg = 0.2 M1 = 0.2 Lw | | | | |
|---|---|---|---|---|---|
| Ly/Lt | 2 | 3 | 5 | 6 | 100 |
| 4 | D | D | D | E | E |
| 5 | C | C | C | D | D |
| 10 | C | C | C | D | D |

| Ly = 0.5 | Lg = 0.18 M1 = 0.5 Lw | | | | |
|---|---|---|---|---|---|
| Ly/Lt | 2 | 3 | 5 | 6 | 100 |
| 4 | Z | Z | Z | Z | Z |
| 5 | F | Z | Z | Z | Z |
| 10 | F | Z | Z | Z | Z |

TABLE 2-continued

| Ly = 0.5 | Lg = 0.18 M1 = 0.35 Lw | | | | |
|---|---|---|---|---|---|
| Ly/Lt | 2 | 3 | 5 | 6 | 100 |
| 4 | D | D | E | F | X |
| 5 | C | C | D | E | E |
| 10 | C | C | D | E | E |

| L = 0.5 | Lg = 0.18 M1 = 0.18 Lw | | | | |
|---|---|---|---|---|---|
| Ly/Lt | 2 | 3 | 5 | 6 | 100 |
| 4 | C | C | D | E | E |
| 5 | A | B | B | C | C |
| 10 | A | A | B | C | C |

| Ly = 0.3 | Lg = 0.1 M1 = 0.3 Lw | | | | |
|---|---|---|---|---|---|
| Ly/Lt | 2 | 3 | 5 | 6 | 100 |
| 4 | Z | Z | Z | Z | Z |
| 5 | Z | Z | Z | Z | Z |
| 10 | Z | Z | Z | Z | Z |

| Ly = 0.3 | Lg = 0.1 M1 = 0.2 Lw | | | | |
|---|---|---|---|---|---|
| Ly/Lt | 2 | 3 | 5 | 6 | 100 |
| 4 | D | D | E | F | X |
| 5 | C | C | D | E | E |
| 10 | B | C | D | E | E |

| Ly = 0.3 | Lg = 0.1 M1 = 0.1 Lw | | | | |
|---|---|---|---|---|---|
| Ly/Lt | 2 | 3 | 5 | 6 | 100 |
| 4 | C | C | D | E | E |
| 5 | A | A | B | C | C |
| 10 | A | A | B | C | C |

The evaluation represented by A to F and Z in Table 2 is the same as that in Table 1.

Embodiment 4

This embodiment describes an example of a memory array including third magnetic memory devices.

Here, the conventional example 3 in Embodiment 3 is used as a conventional example.

A magnetic memory device, in which the direction of extraction of a third conductive wire is changed, is produced in the same manner as the device of Embodiment 3. However, this magnetic memory device differs from that of Embodiment 3 in the shape of a conductive wire (on which a magnetoresistive element is formed). A conductor is formed under an interlayer insulating film, and a contact hole is provided on a drain of a MOS transistor. The conductive wire in Embodiment 3 is fabricated so as to take the shortest route that begins on the contact hole and extends above the conductor. In contrast, the conductive wire in this embodiment is fabricated so as to take a longer route that begins on the contact hole and bends into a substantially L shape above the conductor.

A memory array thus produced has a configuration shown in FIGS. 12 and 13. Magnetoresistive elements 5 are arranged at the intersections of first conductive wires 1 and second conductive wires 2 to form a matrix. Each of the elements 5 is connected to a switching element (MOS transistor) 8 via a third conductive wire 3. A fourth conductive wire 4 for reading is connected to the switching element. A magnetic memory device 10 includes the following: the first conductive wire 1 and the fourth conductive wire 4; the magnetoresistive element 5 and the switching element 7 that are arranged in series between these conductive wires; the third conductive wire 3 that connects the two elements 5, 8; and the second conductive wire 2 that is insulated from the magnetoresistive element 5 and extends in a direction perpendicular to the first conductive wire 1. The first and the second conductive wire 1, 2 are used to apply a magnetic field to the magnetoresistive element 2. The first conductive wire 1 and the second conductive wire 2 or the fourth conductive wire 4 extend in the direction perpendicular to each other.

As shown in FIG. 14, a memory array including a ferromagnetic yoke 9 that is placed around each of a first conductive wire 1 and a second conductive wire 2 also is produced. In this case, Ml, Lg, Lt, Lw, and Ly are set so as to satisfy the above relationships a), b), and c).

As shown in FIG. 15A, a memory array made up of magnetic memory devices, each of which further includes a ferromagnetic yoke 13 that is placed around a third conductive wire 3, is produced. As shown in FIG. 15B, a memory array made up of magnetic memory devices, each of which includes a pair of ferromagnetic members 13 that are placed in contact with the side surfaces of a third conductive wire 3, is produced. This magnetic memory device is formed by the same method as that for the ferromagnetic yoke. However, the ferromagnetic member is deposited obliquely by ion beam deposition so as to have a U shape whose side surfaces are thicker than bottom. Then, the bottom of the U-shaped ferromagnetic member is etched by ICP etching. The thickness of each of the side surfaces of the ferromagnetic member is 8 nm or less.

A memory array made up of magnetic memory devices, each of which uses a ferromagnetic insulator (10 nm Ni ferrite) in an interlayer insulating film between a first conductive wire and a second conductive wire 2, is produced in the same manner as Embodiment 2. In this case, a third conductive wire 3 is buried in the ferromagnetic insulator.

For each of the above memory arrays, an angle (represented by θ in FIG. 16) between the direction of extraction of the third conductive wire 3 from the connection to the magnetoresistive element 5 and the direction of drawing of the second conductive wire 2 is changed.

The pulse power required to reverse the ferromagnetic members of the magnetoresistive elements in these memory arrays was measured. The pulse used was a solitary sinusoidal wave pulse having a length of 5 ns and a half period. Table 3 shows the results.

TABLE 3

| Sample | Ferromagnetic yoke | Ferromagnetic member of third conductive wire | θ (°) | Reference sample | Results |
|---|---|---|---|---|---|
| a1 | — | — | 90 | — | — |
| a2 | — | — | 50 | a1 | C |
| a3 | — | — | 45 | a1 | B |
| a4 | — | — | 0 | a1 | A |
| b1 | used | — | 90 | — | — |
| b2 | used | — | 50 | b1 | C |
| b3 | used | — | 45 | b1 | B |
| b4 | used | — | 0 | b1 | A |
| c1 | — | yoke | 90 | — | — |
| c2 | — | yoke | 50 | c1 | C |

TABLE 3-continued

| Sample | Ferromagnetic yoke | Ferromagnetic member of third conductive wire | θ (°) | Reference sample | Results |
|---|---|---|---|---|---|
| c3 | — | yoke | 45 | c1 | B |
| c4 | — | yoke | 0 | c1 | A |
| d1 | used | yoke | 90 | — | — |
| d2 | used | yoke | 50 | d1 | C |
| d3 | used | yoke | 45 | d1 | B |
| d4 | used | yoke | 0 | d1 | A |
| e1 | — | side surfaces | 90 | — | — |
| e2 | — | side surfaces | 50 | e1 | C |
| e3 | — | side surfaces | 45 | e1 | B |
| e4 | — | side surfaces | 0 | e1 | A |
| f1 | used | side surfaces | 90 | — | — |
| f2 | used | side surfaces | 50 | f1 | C |
| f3 | used | side surfaces | 45 | f1 | B |
| f4 | used | side surfaces | 0 | f1 | A |
| g1 | — | ferromagnetic insulator | 90 | — | — |
| g2 | — | ferromagnetic insulator | 50 | g1 | C |
| g3 | — | ferromagnetic insulator | 45 | g1 | B |
| g4 | — | ferromagnetic insulator | 0 | g1 | A |
| h1 | used | ferromagnetic insulator | 90 | — | — |
| h2 | used | ferromagnetic insulator | 50 | h1 | C |
| h3 | used | ferromagnetic insulator | 45 | h1 | B |
| h4 | used | ferromagnetic insulator | 0 | h1 | A |

In Table 3, compared with a reference sample, "C" indicates equal power, "B" indicates a decrease in necessary power, and "A" indicates a decrease in necessary power by 30% or more. The power of each of the samples b1, c1, d1, e1, f1, g1, and h1 was reduced when compared to a1.

As shown in Table 3, all the samples that have an angle θ of 45° or less can reduce the pulse power for writing.

Embodiment 5

This embodiment describes an example of a driving method of a magnetic memory device.

Using a magnetic memory device produced as the conventional example 3 in Embodiment 3, the magnetization reversal behavior of the free magnetic layer of the magnetoresistive element was examined by applying a current pulse having a length of $\tau 1$ to a first conductive wire and a current pulse having a length of $\tau 2$ to a second conductive wire. These pulses had a minimum pulse intensity that allowed the magnetization to be reversed when both $\tau 1$ and $\tau 2$ were 10 ns. The current pulses were applied as shown in FIG. 17 to confirm the presence or absence of magnetization reversal of the free magnetic layer of the magnetic memory device 10. As shown in FIG. 18, the trailing edges of the applied pulses coincided substantially. Table 4 shows the results.

TABLE 4

| τ1 (ns) | τ2 (ns) | Magnetization reversal |
|---|---|---|
| 10 | 5 | B |
| 10 | 6 | B |
| 10 | 7 | B |
| 10 | 8 | B |
| 10 | 9 | B |

TABLE 4-continued

| τ1 (ns) | τ2 (ns) | Magnetization reversal |
|---|---|---|
| 9 | 10 | A |
| 8 | 10 | A |
| 7 | 10 | A |
| 6 | 10 | A |
| 5 | 10 | A |

In Table 4, "A" indicates the presence of magnetization reversal and "B" indicates the absence of magnetization reversal.

When the pulse application time (if $\tau 1$ and $\tau 2$ differ from each other, the time to apply a longer pulse is used) is 30 ns or less, particularly 10 ns or less, a relatively longer pulse is applied to the conductive wire (the second conductive wire) for applying a magnetic field via the switching element, so that the memory of the device can be rewritten with lower power.

The efficient application of a magnetic field by adjusting the pulse application time as described above is effective for all the magnetic memory devices produced in Embodiments 1 to 4. By using the adjustment of pulse application time in the devices of each of the embodiments, highly efficient application of a magnetic field can be achieved.

As shown in Table 4, the application of the current pulses under the condition of $\tau 1<\tau 2$ also is effective for a conventionally known magnetic memory device, which includes a magnetoresistive element, a pair of conductive wires for generating magnetic flux that changes a resistance value of the magnetoresistive element, and a switching element or an extraction conductive wire connected to the switching element that is placed between the magnetoresistive element and either of the conductive wires.

Embodiment 6

Memory arrays are produced in the same manner as Embodiments 1 to 4, except for the addition of dummy wirings. As shown in FIGS. 19 to 22, the dummy wirings are arranged between first conductive wires 1 and second conductive wires 2. The dummy wirings 61, 62 are produced at the same time as the first or the second conductive wires. Thus, the first conductive wires 1 and the dummy wiring 61 are formed in the same plane and extend in the same direction, while the second conductive wires 2 and the dummy wiring 62 are formed in the same plane and extend in the same direction. A plurality of magnetoresistive elements 5 are arranged in the plane sandwiched between the above two planes.

Each of the dummy wirings 61, 62 is connected to a ground of a driver (not shown) that applies pulses for driving the device.

Compared with a device that does not include the dummy wirings 61, 62, the probability of malfunction can be reduced due to the shield effect of the dummy wirings, which leads to a reduction in crosstalk.

When the crosstalk is reduced, the power that causes magnetization reversal becomes rather large. However, the use of the configurations of the magnetic memory devices in Embodiments 1 to 4 with the driving method in Embodiment 5 can achieve the efficient application of a magnetic field as well as a reduction in crosstalk.

The effect of reducing crosstalk also can be obtained by forming linings 71, 72 on first conductive wires 1 and/or second conductive wires 2, as shown in FIGS. 23 to 26. The linings 71, 72 are arranged so as to project toward a plane formed by magnetoresistive elements 5. Like the dummy wiring, the linings 71, 72 are effective both in the configuration (FIG. 23) where switching elements 7 are connected to the second conductive wires 2 and in the configuration (FIG. 25) where switching elements 8 are insulated from the second conductive wires 2. It is preferable that these projections 71, 72 are provided between the magnetoresistive elements 5 as shown in the drawings.

What is claimed is:

1. A magnetic memory device comprising:

a magnetoresistive element;

a conductive wire for generating magnetic flux that changes a resistance value of the magnetoresistive element; and at least one ferromagnetic member through which the magnetic flux passes, wherein the at least one ferromagnetic member forms a magnetic gap at a position where the magnetic flux passes through the magnetoresistive element, and the following relationships are established:

a) $Ml \leqq 2Lg$;

b) $Lw \leqq 5\ \mu m$; and c) $Ly \leqq 1.0\ \mu m$, where Ml is a length of the magnetoresistive element that is measured in a direction parallel to the magnetic gap, Lg is a length of the magnetic gap, Lw is a length of the ferromagnetic member in a direction of drawing of the conductive wire, and Ly is a length of a path traced by the magnetic flux in the ferromagnetic member.

2. The magnetic memory device according to claim 1, wherein the relationship a) is given by $Ml \leqq Lg$.

3. The magnetic memory device according to claim 1, wherein $Lw \leqq 5\ \mu m$ in the relationship b) is $Lw \leqq 3\ \mu m$.

4. The magnetic memory device according to claim 1, wherein the relationship c) is given by $Ly \leqq 0.6\ \mu m$.

5. The magnetic memory device according to claim 1, wherein the ferromagnetic member forms a magnetic yoke, and the conductive wire is arranged inside the magnetic yoke.

6. A method for manufacturing the magnetic memory device according to claim 5, comprising:

forming a concavity in an insulator, the concavity having a depth D1 and a longitudinal direction parallel to the direction of drawing of the conductive wire;

forming a ferromagnetic member along a surface of the concavity so that a thickness of the ferromagnetic member at each of side surfaces of the concavity is Tf; and forming the conductive wire on a surface of the ferromagnetic member in the concavity so that a thickness of the conductive wire is Tn, wherein D1, Tf, and Tn satisfy the following relationships:

$Tf \leqq 0.33D1$ and $Tn \geqq D1 - 1.5Tf$.

7. The method according to claim 6, further comprising:

restricting the length of the ferromagnetic member in the direction of drawing of the conductive wire to L1, wherein L1 satisfies the following relationship:

$L1 \leqq 5\ (W1 + 2D1)$, where W1 is a width of the concavity in a short side direction.

8. The magnetic memory device according to claim 1, wherein the ferromagnetic member is in contact with the conductive wire.

9. The magnetic memory device according to claim 1, further comprising:

a second conductive wire for generating the magnetic flux, where said conductive wire is identified by a first conductive wire; and a switching element, wherein the first conductive wire and the second conductive wire are arranged so as to sandwich the magnetoresistive element, the first conductive wire is connected electrically to the magnetoresistive element, and the switching element or an extraction conductive wire from the switching element is placed between the second conductive wire and the magnetoresistive element.

10. A method for driving the magnetic memory device according to claim 9, comprising:

changing a resistance value of the magnetoresistive element by magnetic fluxes generated from the first conductive wire and the second conductive wire; and applying a current pulse to the second conductive wire for a longer time than to the first conductive wire.

11. A memory array comprising:

a plurality of magnetoresistive elements arranged in an array, wherein the magnetoresistive elements comprise the magnetoresistive element according to claim 1.

12. The magnetic memory device according to claim 1, wherein Lw and Ly satisfy $Lw/Ly \leqq 5$.

13. The magnetic memory device according to claim 1, wherein Ly and Lt satisfy $Ly/Lt \geqq 5$, where Lt is a thickness of the ferromagnetic member.

14. The magnetic memory device according to claim 1, wherein the length Lw of the ferromagnetic member in the direction of drawing of the conductive wire is restricted to L1, and L1 satisfies the following relationship:

$L1 \leqq 5\,(W2+2\,(Tn+Tf))$, where W2 is a width of the conductive wire, Tn is a thickness of the conductive wire, and Tf is a thickness of the ferromagnetic member at each of side surfaces of the conductive wire.

15. A magnetic memory device comprising:

a magnetoresistive element; and a first conductive wire and a second conductive wire for generating magnetic flux that changes a resistance value of the magnetoresistive element, wherein the first conductive wire and the second conductive wire are arranged so as to sandwich the magnetoresistive element, an insulator placed between the first conductive wire and the second conductive wire comprises a ferromagnetic insulator, the ferromagnetic insulator is arranged so as to cover the side surfaces of each magnetoresistive element, and the ferromagnetic insulator is in contact with the magnetoresistive element.

16. The magnetic memory device according to claim 15, further comprising a switching element, wherein the first conductive wire is connected electrically to the magnetoresistive element, and the switching element or an extraction conductive wire from the switching element is placed between the second conductive wire and the magnetoresistive element.

17. A method for driving the magnetic memory device according to claim 16, comprising:

changing a resistance value of the magnetoresistive element by magnetic fluxes generated from the first conductive wire and the second conductive wire; and applying a current pulse to the second conductive wire for a longer time than to the first conductive wire.

18. A memory array comprising:

a plurality of magnetoresistive elements arranged in an array, wherein the magnetoresistive elements comprise the magnetoresistive element according to claim 15.

19. A magnetic memory device comprising:

a magnetoresistive element;

a switching element;

a first conductive wire and a second conductive wire for generating magnetic flux that changes a resistance value of the magnetoresistive element; and a third conductive wire for electrically connecting the magnetoresistive element and the switching element, wherein the first conductive wire and the third conductive wire are connected electrically to the magnetoresistive element with the magnetoresistive element sandwiched therebetween so as to supply current flowing through the magnetoresistive element, a connection of the third conductive wire to the magnetoresistive element is placed between the magnetoresistive element and the second conductive wire, the second conductive wire is insulated electrically from the magnetoresistive element, and an angle between a direction of extraction of the third conductive wire from the connection and a direction of drawing of the second conductive wire is 45° or less.

20. The magnetic memory device according to claim 19, further comprising:

at least one ferromagnetic member through which the magnetic flux passes, wherein the at least one ferromagnetic member forms a magnetic gap at a position where the magnetic flux passes through the magnetoresistive element.

21. The magnetic memory device according to claim 20, wherein the following relationships are established:

a) $Ml \leqq 2Lg$;

b) at least one selected from $Lw/Ly \leqq 5$ and $Ly/Lt \geqq 5$; and c) $Ly \leqq 1.0\ \mu m$, where Ml is a length of the magnetoresistive element that is measured in a direction parallel to the magnetic gap, Lg is a length of the magnetic gap, Lt is a thickness of the ferromagnetic member, Lw is a length of the ferromagnetic member in a direction of drawing of the conductive wire, and Ly is a length of a path traced by the magnetic flux in the ferromagnetic member.

22. The magnetic memory device according to claim 20, wherein the ferromagnetic member forms a magnetic yoke, and the first conductive wire, the second conductive wire, or the third conductive wire is arranged inside the magnetic yoke.

23. The magnetic memory device according to claim 20, wherein the ferromagnetic member is in contact with at least one selected from the first conductive wire, the second conductive wire, and the third conductive wire.

24. The magnetic memory device according to claim 23, wherein the ferromagnetic member is in contact with any side surfaces of the third conductive wire.

25. The magnetic memory device according to claim 19, wherein an insulator placed between the first conductive wire and the second conductive wire comprises a ferromagnetic insulator.

26. A memory array comprising:

a plurality of magnetoresistive elements arranged in an array, wherein the magnetoresistive elements comprise the magnetoresistive element according to claim 19.

27. A method for driving the magnetic memory device according to claim 19, comprising:

changing a resistance value of the magnetoresistive element by magnetic fluxes generated from the first conductive wire and the second conductive wire; and applying a current pulse to the second conductive wire for a longer time than to the first conductive wire.

28. A method for manufacturing a magnetic memory device, the magnetic memory device comprising:

a magnetoresistive element;

a conductive wire for generating magnetic flux that changes a resistance value of the magnetoresistive element; and at least one ferromagnetic member through which the magnetic flux passes, wherein the at least one ferromagnetic member forms a magnetic gap at a position where the magnetic flux passes through the magnetoresistive element, the at least one ferromagnetic member forms a magnetic yoke, the conductive wire is arranged inside the magnetic yoke, and the following relationships are established:

a) $Ml \leqq 2Lg$;

b) $Lw \leqq 5\ \mu m$; and c) $Ly \leqq 1.0\ \mu m$, where Ml is a length of the magnetoresistive element that is measured in a direction parallel to the magnetic gap, Lg is a length of the magnetic gap, Lw is a length of the ferromagnetic member in a direction of drawing of the conductive wire, and Ly is a length of a path traced by the magnetic flux in the ferromagnetic member, the method comprising:

forming the conductive wire having a thickness Tn on an insulator; and forming a ferromagnetic member along a surface of the conductive wire so that a thickness of the ferromagnetic member at each of side surfaces of the conductive wire is Tf, wherein Tf and Tn satisfy the following relationship:

$Tf \leqq Tn$.

29. The method according to claim 28, further comprising:

restricting a total width of the conductive wire and the ferromagnetic member to W22 after forming the ferromagnetic member, wherein W22 satisfies the following relationship:

$(W2+2Tf) \leqq W22 \leqq 1.2\ (W2+2Tf)$, where W2 is a width of the conductive wire.

30. The method according to claim 28, further comprising:

restricting the length of the ferromagnetic member in the direction of drawing of the conductive wire to L1, wherein L1 satisfies the following relationship:

$L1 \leqq 5\ (W2+2\ (Tn+Tf))$, where W2 is a width of the conductive wire.

* * * * *

UNITED STATES PATENT AND TRADEMARK OFFICE

CERTIFICATE OF CORRECTION

PATENT NO. : 6,954,372 B2
DATED : October 11, 2005
INVENTOR(S) : Matsukawa et al.

It is certified that error appears in the above-identified patent and that said Letters Patent is hereby corrected as shown below:

Title page,
Item [73], Assignee, "Matsushita Electric Co., Ltd.," should read
-- Matsushita Electric Industrial Co., Ltd., --.
Item [57], ABSTRACT,
Line 1, "A magnetic memory device that includes" should read
-- A magnetic memory device includes --.
Line 15, "of the drawing" should read -- of drawing --.

Signed and Sealed this

Sixth Day of June, 2006

JON W. DUDAS
*Director of the United States Patent and Trademark Office*